: US 7,640,363 B2

(12) United States Patent
Teodosiu et al.

(10) Patent No.: US 7,640,363 B2
(45) Date of Patent: Dec. 29, 2009

(54) APPLICATIONS FOR REMOTE DIFFERENTIAL COMPRESSION

(75) Inventors: Dan Teodosiu, Bellevue, WA (US); Jay W. Paulus, Seattle, WA (US); Joseph A. Porkka, Bellevue, WA (US); Nikolaj S. Bjorner, Woodinville, WA (US); Robert A. Post, Jr., Redmond, WA (US); William Scheidel, Sammamish, WA (US); Richard D. Chinn, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 691 days.

(21) Appl. No.: 11/059,916

(22) Filed: Feb. 16, 2005

(65) Prior Publication Data

US 2006/0184652 A1 Aug. 17, 2006

(51) Int. Cl.
*G06F 15/16* (2006.01)
(52) U.S. Cl. .................. 709/247; 707/203; 717/170
(58) Field of Classification Search .......... 709/221, 709/247
See application file for complete search history.

(56) References Cited

U.S. PATENT DOCUMENTS

| 6,230,316 | B1 * | 5/2001 | Nachenberg | 717/169 |
| 7,096,311 | B2 * | 8/2006 | Chiang | 711/100 |
| 7,185,322 | B2 * | 2/2007 | McCullough et al. | 717/136 |
| 2002/0078241 | A1 * | 6/2002 | Vidal et al. | 709/247 |
| 2003/0177485 | A1 * | 9/2003 | Waldin et al. | 717/169 |
| 2004/0210591 | A1 * | 10/2004 | Hirschfeld et al. | 707/100 |

* cited by examiner

*Primary Examiner*—Hassan Phillips
*Assistant Examiner*—Joseph L Greene
(74) *Attorney, Agent, or Firm*—Merchant & Gould, P.C.

(57) ABSTRACT

Remote differential compression is integrated within applications. Objects are updated between two or more computing devices using remote differential compression (RDC) techniques such that required data transfers are minimized. An algorithm provides enhanced efficiencies for allowing the receiver to locate a set of objects that are similar to the object that needs to be transferred from the sender. Once this set of similar objects has been found, the receiver may reuse any chunks from these objects during the RDC algorithm.

20 Claims, 31 Drawing Sheets

```
structure Entry
    var isMax as Boolean = false
    var hash as Integer = 0
    var offset as Integer = 0 class LocalMaxCut
    h as Integer
    var min as Integer = 0
    var max as Integer = 0
    var M as Array of entry = new Entry[h]

CutPoint(hash as Integer, offset as Integer) as Boolean
        var result = false
        step
            if M[max].offset + h + 1 = offset then
                result := M[max].isMax
                max := (max+1) mod h
        step
          while true do step
            step
              if M[min].hash > hash then
                step
                  min := (min-1) mod h
                step
                  M[min] := Entry(false, hash, offset)
                  return result
              if M[min].hash = hash then
                  M[min] := Entry(false, hash, offset)
                  return result
              if M[min].hash < hash and min = max then
                  M[min] := Entry(true, hash, offset)
                  return result
            step
```

FIG. 9

```
structure Entry
  var offset as Integer = 0
  var isMax as Boolean = false
  var hash as Integer = 0 class LocalMaxCut
  horizon as Integer
  var hashes as Seq of Integer
  var k as Integer = 0
  var l as Integer = 0
  var A as Array of Entry = new Entry[horizon]
  var B as Array of Entry = new Entry[horizon]

CutPoints() as Seq of Integer
    var cuts as Seq of Integer = []
    for window = 0 to Length(hashes)/horizon do step
      let first = window*horizon
      let last = min((window+1)*horizon,Length(hashes)))-1
      cuts := cuts + CutPoint(first, last)
    return cuts CutPoint(first as Integer, last as Integer) as Seq of Integer
    step // Initialize A with the first entry at the offset
      k := 0
      A[0] := Entry(last,true,hashes[last])
      last := last - 1
    step // Update A[k] in the interval up to B[l]'s horizon
      while last > B[l].offset + horizon do step
        Insert(last)
        last := last - 1
    step // Update A[k] and B[l] in the remaining interval
      while last >= first do step
        Insert(last)
        if B[l].hash <= hashes[last] then
          B[l].isMax := false
        last := last -1
    step // determine whether A[k] is a cutpoint with respect to B
      A[k].isMax := A[k].isMax and
          forall j in {0..l} holds
            (B[j].offset + horizon < A[k].offset or
             B[j].hash < A[k].hash)
    step // Set B to A for the next round and return cut-point
      B, l := A, k
      return if B[l].isMax then [B[l].offset] else []
```

FIG. 10

```
class LocalMaxCut
  Insert(offset as Integer)
    if hashes[offset] >= A[k].hash then
      if hashes[offset] = A[k].hash then
        // duplicated hashes within distance
        // of "horizon" are not maximal.
        A[k].isMax := false
      else
        A[k+1] := Entry(offset, true, hashes[offset])
        k := k + 1
```

FIG. 11

APPLICATIONS FOR REMOTE DIFFERENTIAL COMPRESSION

BACKGROUND OF THE INVENTION

The proliferation of networks such as intranets, extranets, and the internet has lead to a large growth in the number of users that share information across wide networks. A maximum data transfer rate is associated with each physical network based on the bandwidth associated with the transmission medium as well as other infrastructure related limitations. As a result of limited network bandwidth, users can experience long delays in retrieving and transferring large amounts of data across the network.

Data compression techniques have become a popular way to transfer large amounts of data across a network with limited bandwidth. Data compression can be generally characterized as either lossless or lossy. Lossless compression involves the transformation of a data set such that an exact reproduction of the data set can be retrieved by applying a decompression transformation. Lossless compression is most often used to compact data, when an exact replica is required.

In the case where the recipient of a data object already has a previous, or older, version of that object, a lossless compression approach called Remote Differential Compression (RDC) may be used to determine and only transfer the differences between the new and the old versions of the object. Since an RDC transfer only involves communicating the observed differences between the new and old versions (for instance, in the case of files, file modification or last access dates, file attributes, or small changes to the file contents), the total amount of data transferred can be greatly reduced. RDC can be combined with another lossless compression algorithm to further reduce the network traffic. The benefits of RDC are most significant in the case where large objects need to be communicated frequently back and forth between computing devices and it is difficult or infeasible to maintain old copies of these objects, so that local differential algorithms cannot be used.

SUMMARY OF THE INVENTION

Briefly stated, the present invention is related to a method and system for using remote differential compression within different applications and protocols to reduce their network bandwidth utilization or storage requirements. Remote differential compression (RDC) techniques are utilized such that required data transfers over a network between multiple machines executing an application or using a communication protocol are minimized, or such that the storage requirements of an application are reduced.

In one aspect, an algorithm provides enhanced efficiencies by allowing the sender to communicate a small amount of meta-data to the receiver, and the receiver to use this meta-data to locate a set of objects that are similar to the object that needs to be transferred from the sender. Once this set of similar objects has been found, the receiver may reuse any parts of these objects as needed during the RDC algorithm.

A more complete appreciation of the present invention and its improvements can be obtained by reference to the accompanying drawings, which are briefly summarized below, to the following detailed description of illustrative embodiments of the invention, and to the appended claims.

BRIEF DESCRIPTION OF THE DRAWINGS

Non-limiting and non-exhaustive embodiments of the present invention are described with reference to the following drawings.

FIG. 9 is a diagram of example instruction code for an example chunking procedure;

FIGS. 10 and 11 are diagrams of example instruction code for another example chunking procedure;

DETAILED DESCRIPTION OF THE PREFERRED EMBODIMENT

Figure 1:
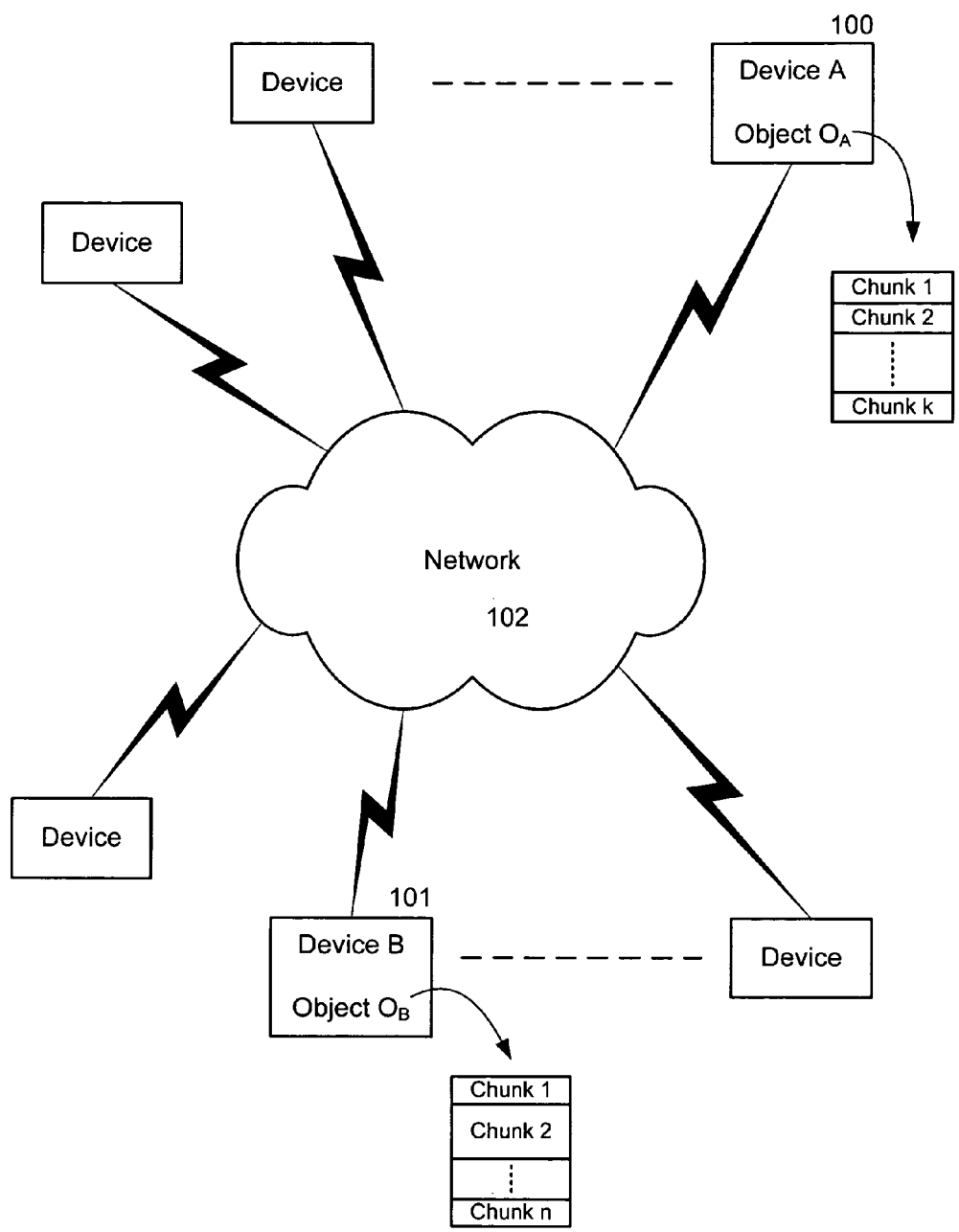
FIG. 1 is a diagram illustrating an operating environment.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

The present invention is described in the context of local and remote computing devices (or "devices", for short) that have one or more commonly associated objects stored thereon. The terms "local" and "remote" refer to one instance of the method. However, the same device may play both a "local" and a "remote" role in different instances. Remote Differential Compression (RDC) methods are used to efficiently update the commonly associated objects over a network with limited-bandwidth. When a device having a new copy of an object needs to update a device having an older copy of the same object, or of a similar object, the RDC method is employed to only transmit the differences between the objects over the network. An example described RDC method uses: (1) a recursive approach for the transmission of the RDC metadata, to reduce the amount of metadata transferred for large objects; (2) a local maximum-based chunking method to increase the precision associated with the object differencing such that bandwidth utilization is minimized; and (3) a similarity determination method to identify similar objects. Some example applications that benefit from the described RDC methods include: peer-to-peer replication services, file-transfer protocols such as SMB, virtual servers that transfer large images, email servers, cellular phone and PDA synchronization, database server replication, to name just a few.

File Replication Service

Figure 19:
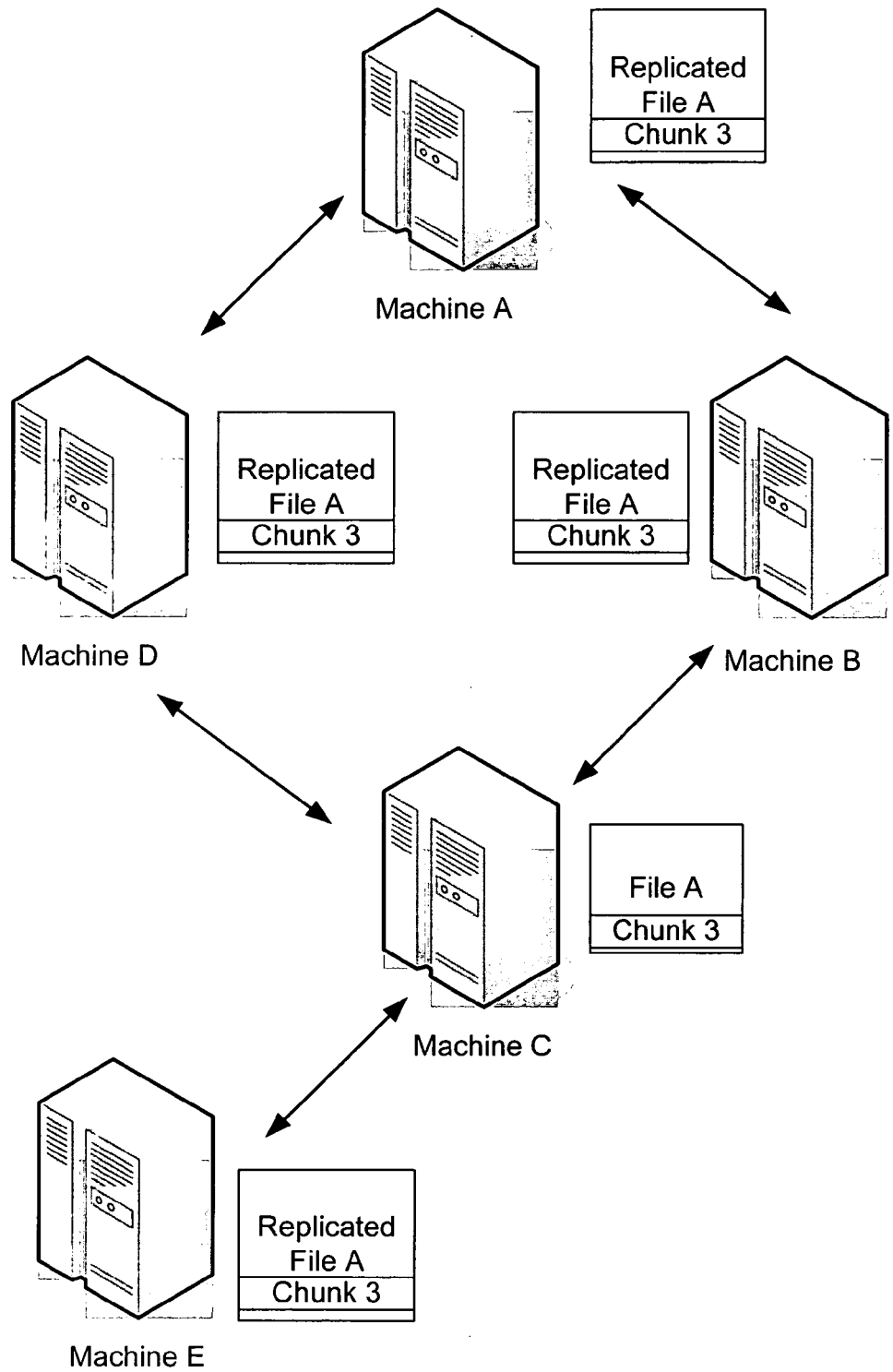
FIG. 19 shows a File Replication service (FRS) topology using RDC.

FIG. 19 shows a File Replication service (FRS) topology using RDC, in accordance with aspects of the invention. FRS (also known as the Distributed File System Replication service, or DFSR) is a technology that replicates files and folders at nearly full-fidelity between multiple systems arranged in a configurable topology. FRS replication may be a multi-master system (meaning any of the systems can contribute changes) and is triggered upon a file close. Exemplary uses of FRS are for replicating files stored in the SYSVOL shared folder on domain controllers, for Distributed File System (DFS) shared folders, and for Branch Office publication collaboration, and data protection scenarios. When FRS detects that a change has been made to a file or folder within a replicated content set, FRS replicates the updated file or folder to the other systems according to the configured topology.

Referring to FIG. 19, assume that File A on Machine C was updated and replicated to Machine A, B, D, and E in response to the update. Because FRS may be a multi-master replication service, any server, such as Machines A-E that participates in replication can generate changes. In addition, FRS can resolve file and folder conflicts to make data consistent among servers.

In some FRS systems, the updated file or folder is always replicated in its entirety to the other servers. Even if only a single byte of data has changed in a 500 MB file, the entire 500 MB file is transferred to each of the other servers. By utilizing RDC in the file transfer process the amount of data that must be transferred can be substantially reduced.

In the FRS case, assume that FRS has been used to replicate a new object, File A, from Machine C to the other machines in such a manner that File A is now identical on each machine. If the object (File A) on Machine C is then modified, Machines A, B, D, and E have a different incarnations of the same resource from Machine C. Machines A, B, D, and E hold the old version, while Machine C holds the new version that is a slight (or incremental) edit of the content of File A.

Without using an RDC algorithm, file A would be copied in its entirety to the other machines irrespective to the amount of data that was actually modified. By introducing RDC, however, only the chunks of File A that contain data that has been modified must be transferred. In this particular example, only Chunk 3 of File A has been changed. Only Chunk 3, therefore, is transferred to the other machines. This reduces the amount of data transferred and increases the speed of replication over slow links by not resending data that is identical between the objects on the machines.

Some FRS systems use RDC on marshaled (or staged) versions of the files; these versions contain a representation of all the data streams in the file, as well as the file meta-data (such as last-modified time and ACLs). Because of this, RDC is highly effective in replicating small changes to e.g. the ACLs of a file. Users may often only change the permissions of a file or set of files. Using RDC allows FRS to only replicate the changes to the permissions, not the entire set of files.

Another exemplary use of RDC for FRS is for replicating media files. Media applications often modify the media files to include meta-data such as keywords or user ranking. FRS can be used to replicate media files in a peer-to-peer Internet file sharing applications (such as an application embedded in an operating system, or shipped as part of a messaging application). By using RDC to transfer the files, FRS can avoid having to re-replicate an entire content set when e.g. keywords are added by the user to their media files.

Another exemplary use of RDC and the similarity technique described in herein is when FRS is used to distribute LOB (Line-of-Business) applications to branch or remote offices in the form of Virtual Server or Virtual PC images (VHD files). New images may have a high degree of similarity to old ones, e.g. because they contain the same operating system image. Updates (such as patches) to existing images will also have a very high degree of similarity to the old images. In both of these cases, using RDC and similarity detection can lead to substantial bandwidth savings when transferring these images.

File Copying Between Machines

Figure 20:
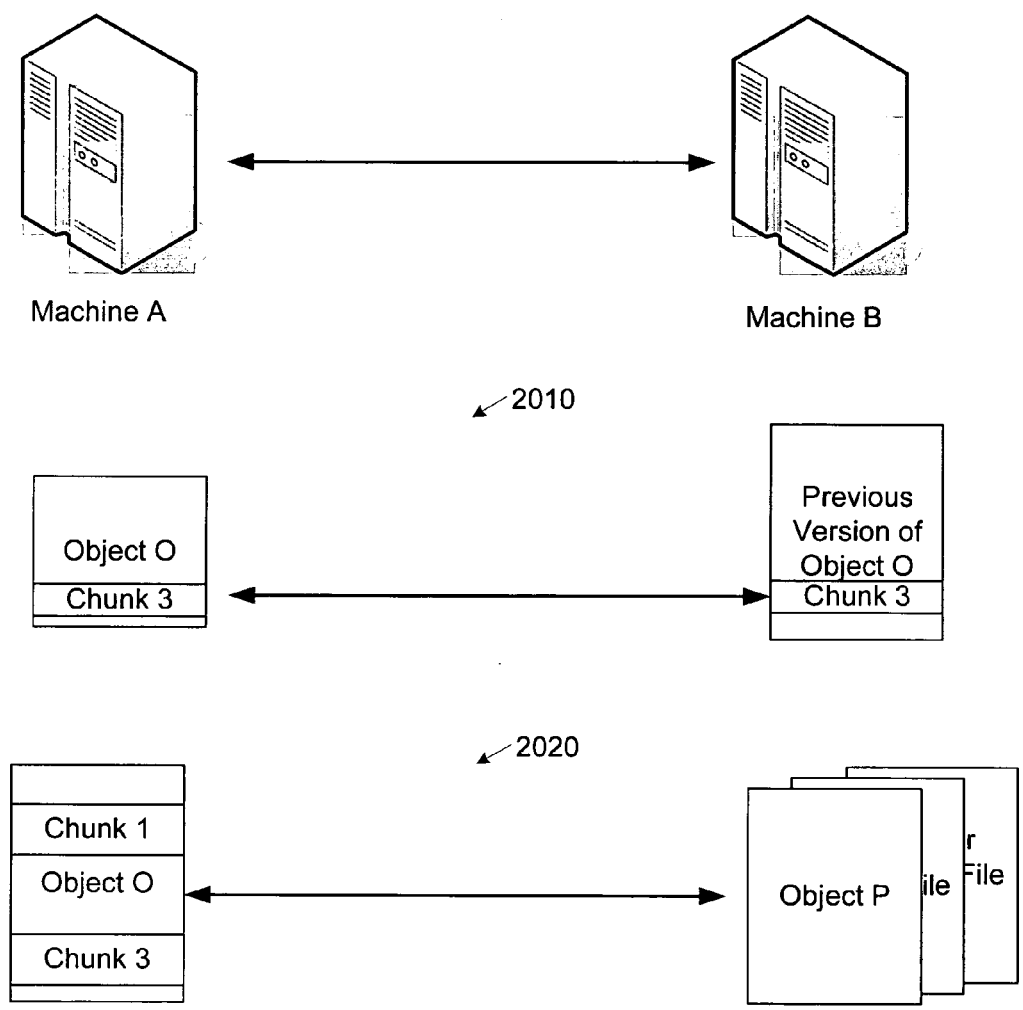
FIG. 20 illustrates using RDC to copy between machines.

FIG. 20 illustrates using RDC to copy data between machines, in accordance with aspects of the present invention. There are many different copying tools, such as Windows Explorer, xcopy and robocopy, and APIs that are used to copy files from one machine to another. One limitation of these tools and APIs is that data that may be already present on the destination server is not utilized during the copy process. When copying a file, the entirety of the file is transferred from Machine A to Machine B. This limitation can be overcome by using RDC and similarity detection during the copy process to reduce the amount of bandwidth and the amount of time required to copy a file.

The following are two exemplary scenarios for which RDC is applicable:

(1) A file (denoted as Object A) is copied from Machine A to Machine B for which a previous version (denoted as Object B) already exists on Machine B (See 2010); and (2) A file is copied from Machine A to Machine B for which no previous version already exists on Machine B but similar files do exist on Machine B (See 2020).

In the first scenario (2010), this is similar to the File Replication scenario described previously. The RDC algorithm is used to transfer the differences between the two files.

In the second scenario (2020), though no preexisting version of Object O exists on Machine B, the RDC algorithm can still be used by acting on other similar files available on the destination server. A similar file is defined as a file which shares a percentage of chunks with the source file. These files may not necessarily be older versions of the source file, but chunks from these files may be used to construct the desired destination file.

In this particular example, assume that a copy tool or API is used to copy a new object, Object O, from Machine A to Machine B on which Object O does not already exist. Also assume that Object P exists on Machine B and is somewhat similar to Object O (meaning some of the chunks in Object O are identical to corresponding chunks in Object P). Also note that chunks could potentially be used from multiple objects on Machine B if desired.

Without using RDC, Object O is copied in its entirety to Machine B. By introducing RDC and utilizing the chunks found in Object P, only the chunks of Object O that are unique to Object O are transferred. This reduces the amount of data transferred and increases the speed of the copy over slow links by not resending data that is identical between Object O and Object P.

In an alternate embodiment, the SMB (Server Message Block) protocol is modified to support RDC transfers between files, for instance by adding a fcntl( ) that explicitly requests RDC functionality when writing a file to a server, or when reading a file from a server. In the former case, a remote file handle may be indicated that will be used by SMB as the RDC source (or old version of the file); in the latter case, a local file handle may be indicated.

Peer-to-Peer (P2P) File Sharing

Figure 21:
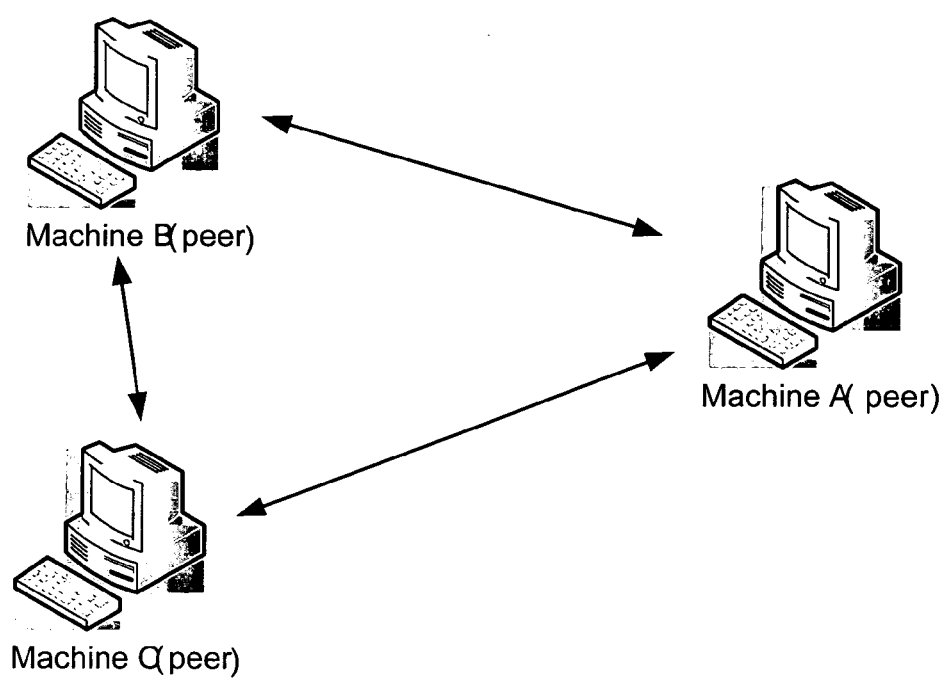
FIG. 21 shows using RDC in a Peer-to-peer (P2P) networking environment.

FIG. 21 shows using RDC in a Peer-to-peer (P2P) networking environment, in accordance with aspects of the invention. P2P is a serverless networking technology that allows several network devices to share resources and communicate directly with each other. For collaboration, peer-to-peer networking allows the sharing of a workspace, files, and experiences. Three Degrees is one such P2P application that connects a small group of family and friends and allows them to easy share content such as audio, video, and digital photographs with each other.

RDC improves the P2P file sharing experience in a similar manner to the File Copying between Machines application described previously. In this case, a P2P application is used to copy files between two clients.

Many types of files, such as media files and image files, may frequently experience small modifications, for instance:

Media files are modified by a Media Player, which downloads information such as a composer, singer, etc. from the Internet and writes this information as new properties to the played media files.

Media file ratings may be stored in the files by the Media Player. Every time the user changes the ratings, the media player modifies the respective files.

Image library applications (such as Microsoft's Digital Image Library) may store keywords with the images causing the image files to be modified every time a user changes the image keywords.

Files associated with mail files may be modified every time email messages are added or removed from a mailbox. Additionally, these files get modified even when messages are only read. The modifications in all cases are incremental, and only affect a very small portion of the files.

Client Side Caching

Figure 22:
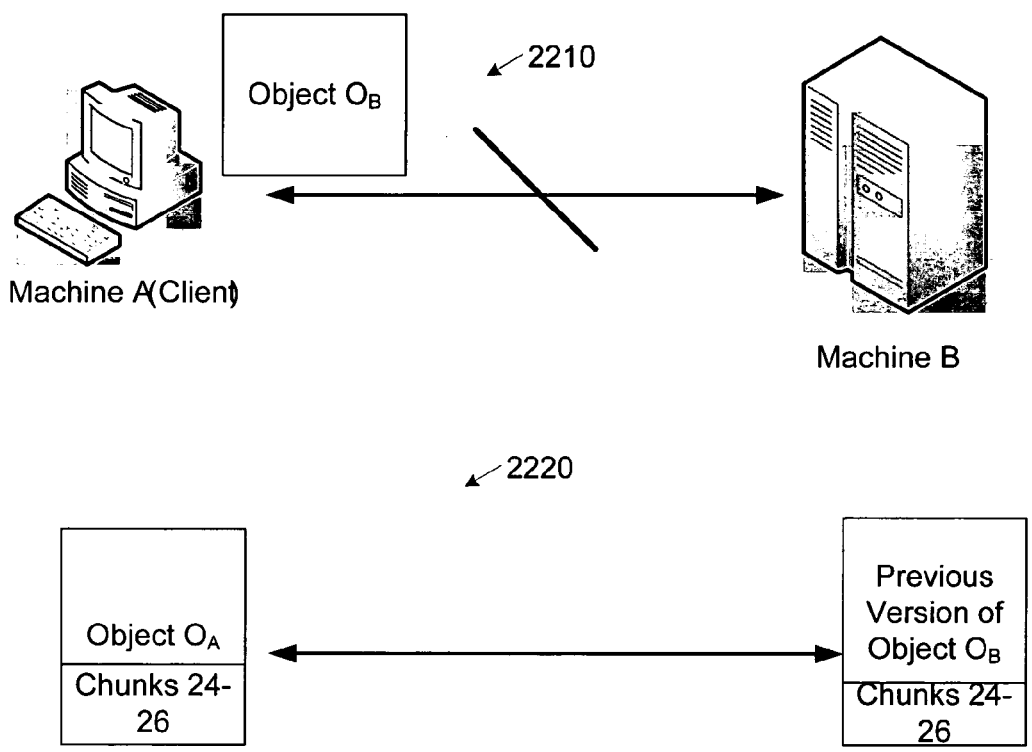
FIG. 22 illustrates using RDC in Client Side Caching (CSC)

FIG. 22 illustrates using RDC in Client Side Caching (CSC), in accordance with aspects of the invention. In CSC, also known as Offline Files, users can disconnect from the network and work as if still connected. When the computer is offline, the files and folders of interest to the user are cached on the computer and appear in the same directory that they appear in online—as if they are still in the same location on the network. This allows the user working offline to edit files. The next time the user connects to the network, the offline changes are synchronized with the network share. Any changes that were made while the user was working offline are updated to the network.

CSC is especially useful for mobile users with portable computers because they can use it to access their files when they are not connected to the network. Thus users can always open, update, and work with network files when they are not connected to the network.

One limitation of CSC is that the updated file or folder is always written back in its entirety from the client back to the server upon reconnection. Similarly, files that have changed on the server will be fetched in their entirety from the server to the client the next time the client's cache is synchronized. By utilizing RDC in the file transfer process the amount of data that must be transferred can be substantially reduced. This is especially useful for mobile users as they attempt to sync documents over slow links while they are away from the office. Using RDC, even large files that change frequently, may be included in the CSC.

In this case, assume that a user on Machine A (the client) has started working on Object $O_B$ stored on Machine B (the server) while online, and then disconnects from Machine B (2210); assume Object $O_B$ has been cached on Machine A. Using CSC, the user continues to make changes to Object $O_B$ on Machine A creating a newer version, Object $O_A$. Machines A and B now have two different versions of the same resource, Object $O_A$ and Object $O_B$, respectively. Machine B holds an old version, while Machine A holds a version that is a slight (or incremental) edit of the content.

Without RDC, Object $O_A$ would be copied in its entirety to Machine B irrespective to the amount of data that was actually modified. This is an especially costly operation if the user had made only slight updates to a large presentation and was now reconnecting to Machine B via a slow link. By using RDC, however, only the chunks of Object $O_A$ that contain data that has been modified must be transferred. In this case, chunks 24-26 are the only chunks transferred to Machine B. This reduces the overall amount of data transferred and increases the speed of syncs over slow links by not resending data that is identical between Object $O_A$ and Object $O_B$. Mobile users are therefore better able to exploit the caching performed by CSC by eliminating the need to constantly copy files from the client to the server (and vice versa) in their entirety.

Accessing and Editing Documents on SharePoint Sites

Figure 23:
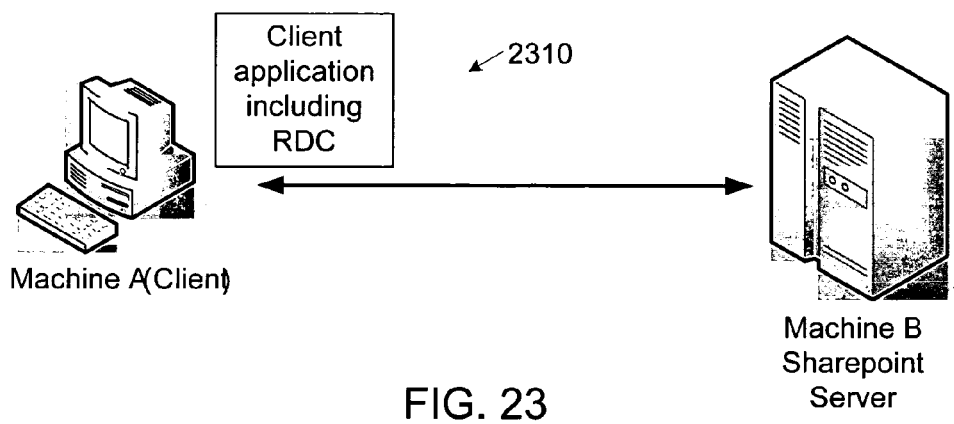
FIG. 23 shows using RDC within client software.

FIG. 23 shows using RDC within client software, in accordance with aspects of the present invention. SharePoint™ has become an increasingly popular tool for document publishing and collaboration among small groups of people. In general, users publish a document to the SharePoint site for a group of people to read and review. Edits to the document can then be made by either the original publisher or any of the members of the group. During this time, each of the users of the group that edits the document has had to download and upload each version of the document in its entirety even though only a small portion was changed at each revision. As knowledge worker documents increase in size, this becomes especially inefficient if any of the users is collaborating over a slow link (such as when they are remotely connected).

The following are two exemplary scenarios for which RDC is applicable: (1) A user downloads a new document from a SharePoint site, makes some incremental changes and then uploads the document back to the site; and (2) A user downloads a document from a SharePoint site that they have edited before, makes some additional changes, and then uploads the document back to the site.

In the first scenario, assume that Machine A (a user's laptop or desktop) has downloaded a new object, Object $O_B$, from Machine B (a SharePoint Server). If the object on Machine A is then modified, Machines A and B have two different versions of the same resource, Object $O_A$ and Object $O_B$, respectively. Machine B (the SharePoint Server) holds an old version, while Machine A (the client) holds a version that is a slight (or incremental) edit of the content.

Before RDC, Object $O_A$ would be copied in its entirety to Machine B when Object $O_A$ (the document that has been edited) is uploaded back to the SharePoint Server, irrespective to the amount of data that was actually modified. By introducing RDC, however, only the chunks of Object $O_A$ that contain data that has been modified with respect to Object $O_B$ (a copy of which is still present on the SharePoint Server, Machine B) must be transferred.

This reduces the amount of data transferred and increases the speed of transfer over slow links by not resending data that is identical between Object $O_A$ and Object $O_B$. Therefore uploading the object requires less time.

The second scenario is identical to the first scenario except that Machine B now holds the slightly newer version of Object $O_B$, while Machine A holds the old version. By using RDC, downloading a document that contains incremental changes of a document that was previously downloaded will download faster since only the chunks that are different will be transferred.

In one embodiment (2310), RDC is included in any client software that can be used to access SharePoint sites, such as a web browser (such as Internet Explorer™), or the caching mode supported in an email client (such as Outlook), or other software.

Replication between SharePoint Sites

In order to make data stored on SharePoint sites highly available, multiple replicas of a SharePoint site can be set up. This is similar to the FRS example described above. Data is replicated between the SharePoint sites when changes are made, thus keeping each of the replica sites up to date.

In this case, assume that two SharePoint sites have been set up in which Machine A contains the master site and Machine B contains a replica of the site and acts as a slave. A new object, Object $O_B$, is then replicated from Machine A to Machine B in such a manner that Object $O_B$ is now identical on each machine. If the object on Machine A is then modified, Machines A and B have two different incarnations of the same resource, Object $O_A$ and Object $O_B$, respectively. Machine B holds the old version Object $O_B$, while Machine A holds the new version Object $O_A$ that is a slight (or incremental) edit of the content of Object $O_B$.

Before RDC, Object $O_A$ would be copied in it's entirety to Machine B irrespective to the amount of data that was actually modified. By introducing RDC, however, only the chunks of Object $O_A$ that contain data that has been modified must be transferred. This reduces the amount of data transferred and increases the speed of replication over slow links by not resending data that is identical between Object $O_A$ and Object $O_B$.

Transferring an Offline Address Book

Figure 24:
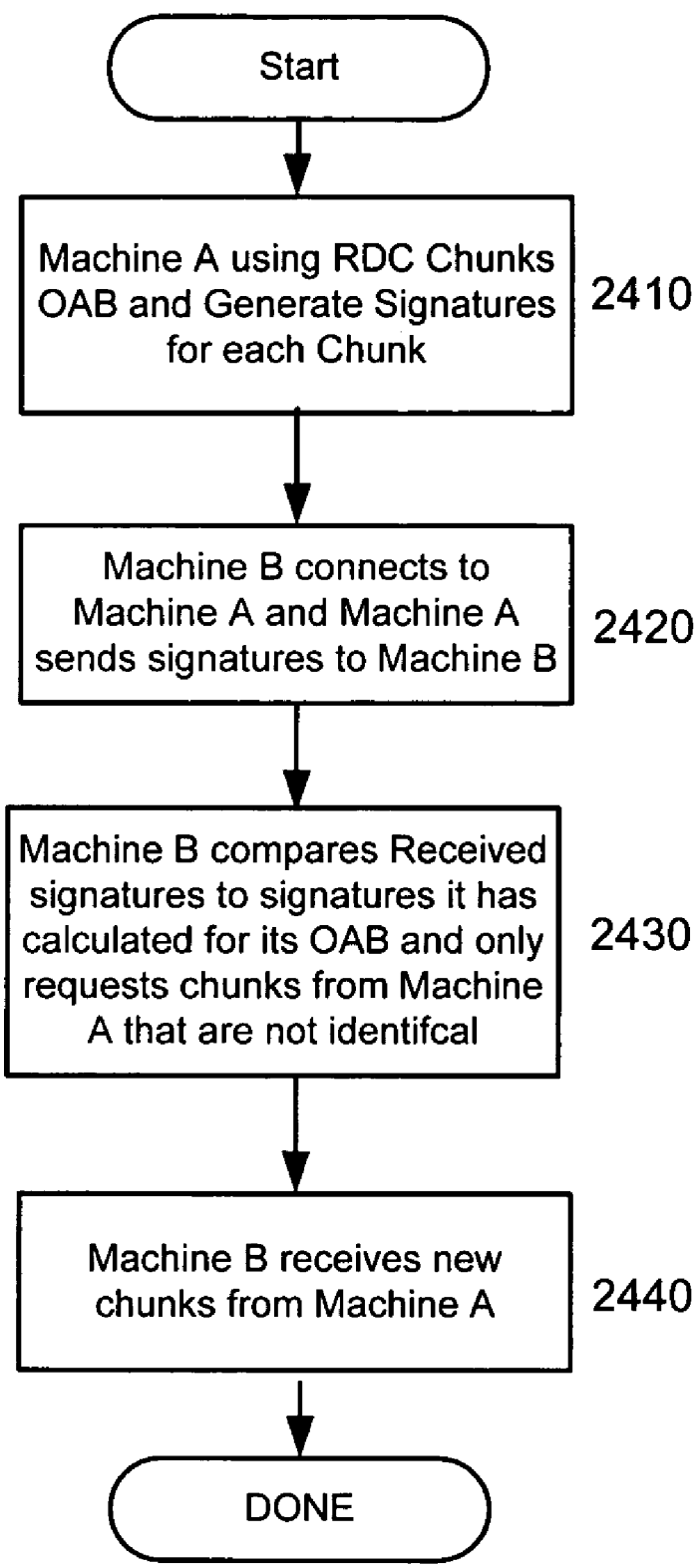
FIG. 24 shows a process for transferring an Offline Address Book.

FIG. 24 shows a process for transferring an Offline Address Book, in accordance with aspects of the invention. Administrators can configure an Offline Address Book (OAB) so that remote users can use to get information about other users in the organization. Users of Outlook can download the offline Address Book to their portable computers when their email and/or contacts program connects to the associated server. The OAB can contain any list of recipients that you specify. This data is stored in the OAB system folder. Note that you can create one OAB for each site in your organization.

The OAB server is the computer on which the OAB files are generated and stored. When remote users download the OAB to their local computers, they connect to an OAB system folder from which the OAB files are read and copied.

One limitation of the current scheme is that each day, the server generates a full OAB and a differential file from the previous day. The server stores the differential file and the full file for the current day and stores only the differential files for the previous days. Both the server and client must keep track of a sequence number to determine which differential files must be applied on the client in order to bring the client OAB up to date.

RDC can eliminate the need for generating and storing consecutive diff files and having to keep track of special sequence numbers by generating the diff files in real time for each client. Assume that Machine A is an OAB server and Machine B is a client running Outlook. In this case, the OAB would still be generated every 24 hours on Machine A, but instead of generating a diff file against the previous OAB, Machine A, using RDC, would chunk the OAB and generate the signatures for each of the chunks (2410). When Machine B connects to Machine A to acquire the new OAB, Machine A will simply send the pre-calculated signatures (2420). Machine B will compare these signatures to the signatures it calculates (or has cached) for its OAB and then request only the chunks which are not identical (2430). The result is that the only the differences will still be transferred (2440), but actual diff files will no longer be created or maintained. This also eliminates any issues resulting from missing diff files or sequence numbers that have become misaligned.

E-Mail Attachments

E-mail has become the number one tool for document collaboration among groups of people. In general, a user will send out a draft of a document to a group of people to review. One or more of these people will then make some edits to the document and send the updated version back out to the group. This review process will continue until the document is finalized. During this time, each of the users of the group has had to upload and download each version of the document in its entirety even though only a small portion was changed at each revision. As knowledge worker documents increase in size, this becomes especially inefficient if any of the users is collaborating over a slow link (such as when they are remotely connected).

The following are two exemplary scenarios for which RDC is applicable:

A user receives a document as an e-mail attachment, makes some incremental changes and then sends the document back as another email attachment to the sender, or to a set of recipients such as a distribution list.

A user receives a document as an e-mail attachment that includes incremental changes from a document received in a previous e-mail attachment.

In the first scenario, assume that Machine A (a user's laptop or desktop) has received a new object, Object $O_B$, as an email attachment from Machine B (a Mail Server). If the object on Machine A is then modified, Machines A and B have two different incarnations of the same resource, Object $O_A$ and Object $O_B$, respectively. Machine B (the server) holds an old version, while Machine A (the client) holds a version that is a slight (or incremental) edit of the content.

Without RDC, Object $O_A$ would be copied in its entirety to Machine B when the email (and the attached Object $O_A$) is sent to the Server, irrespective to the amount of data that was actually modified. By introducing RDC, however, only the chunks of Object $O_A$ that contain data that has been modified with respect to Object $O_B$ (a copy of which is still present on the Server, Machine B) must be transferred. There are two ways to locate Object $O_B$ on the Server:

If the email containing Object $O_A$ as an attachment is a reply to a previous email, the Server may retrieve the previous attachments that were sent as part of that email thread.

If the email containing Object $O_A$ as an attachment is not a reply to a previous email, the Server may use similarity detection to locate similar attachments (in this case, including Object $O_B$) that may be used for the transfer.

This reduces the amount of data transferred and increases the speed of replication over slow links by not resending data that is identical between Object $O_A$ and Object $O_B$. Therefore sending the mail that includes the modified object requires less time.

The second scenario is identical to the first scenario except that Machine B now holds the slightly newer version of Object $O_B$, while Machine A holds the old version. By using RDC, receiving a mail that contains incremental changes of a document that was previously received will download faster since only the chunks that are different will be transferred.

In one embodiment, the MAPI protocol is updated to include the RDC algorithm.

Enhancing a Web Browser

Web browsers allow users to directly download and upload files from the Internet, by using the HTTP and WebDAV protocols, respectively. Currently, files downloaded or uploaded are always transferred in their entirety. Web browsers can be enhanced using RDC to improve download and upload speeds by more efficiently performing data transfers as described above in the File Copying between Machines application. In the download case, Machine A is the server hosting the file to be downloaded and Machine B is the client performing the download. In the upload case, Machine A is the client performing the upload and Machine B is the destination server.

Anywhere Access

Figure 25:
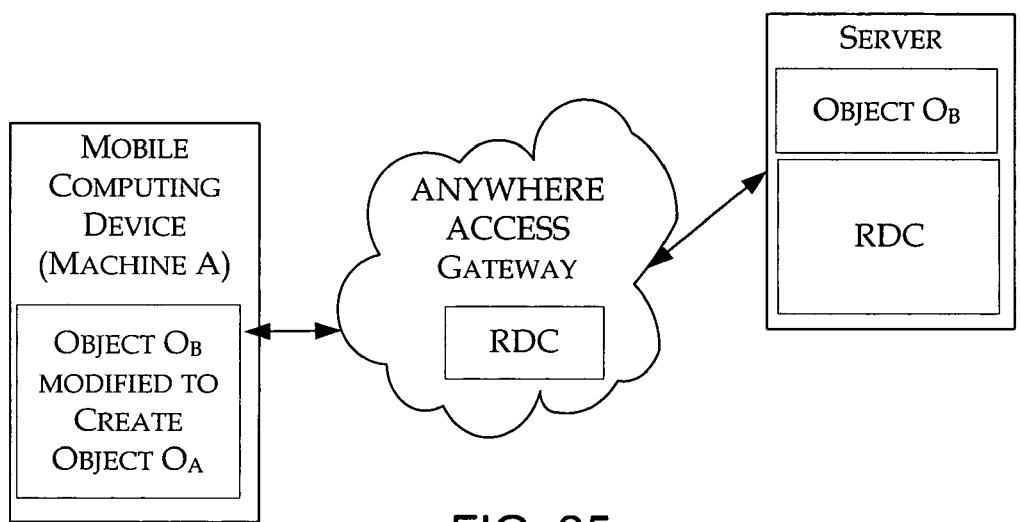
FIG. 25 illustrates using RDC in a corporate roaming scenario.

FIG. 25 illustrates using RDC in a corporate roaming scenario, in accordance with aspects of the invention. Anywhere Access provides seamless file access to computers which are roaming outside the corporate network. This type of access allows administrators to utilize a gateway machine to publish corporate file sharing resources to roaming users, making them available for access from outside the firewall without requiring a full-fledged VPN. The roaming machine seamlessly intercepts i/o requests bound for a particular fileshare (i.e. \\server1\share) and redirects those requests to the Anywhere Access Gateway. The Anywhere Access Gateway functions as a trusted man in the middle and passes traffic to the selected file share resource. RDC usage in this scenario allows communication traffic between the client PC and the Anywhere Access Gateway to be greatly reduced.

Two exemplary scenarios for which RDC is applicable include: (1) A roaming client downloads a new object from a corporate network by way of an Anywhere Access Gateway, makes some incremental changes and then uploads the document back to the corporate network; and (2) A roaming client downloads an object from a corporate network by way of an Anywhere Access Gateway, where the object is a newer version of an object the roaming client had previously downloaded.

In the first scenario, assume that Machine A (a user's laptop or desktop outside the corporate network) has downloaded a new object, Object $O_B$, from Machine B (a computer on the corporate network via an Anywhere Access Gateway). If the object on Machine A is then modified, Machines A and B have two different versions of the same resource, Object $O_A$ and Object $O_B$, respectively. Machine B (the server on the corporate network) holds an old version, while Machine A (the client) holds a version that is a slight (or incremental) edit of the content.

Before RDC, Object $O_A$ would be copied in its entirety to Machine B when Object $O_A$ (the object that has been edited) is uploaded back to the server, irrespective to the amount of data that was actually modified. By introducing RDC, however, only the chunks of Object $O_A$ that contain data that has been modified with respect to Object $O_B$ (a copy of which is still present on the server, Machine B) must be transferred.

This reduces the amount of data transferred and increases the speed of transfer over slow links by not resending data that is identical between Object $O_A$ and Object $O_B$. Therefore uploading the object requires less time.

The second scenario is identical to the first scenario except that Machine B now holds the slightly newer version of Object $O_B$, while Machine A holds the old version. By using RDC, downloading an object that contains incremental changes of an object that was previously downloaded will download faster since only the chunks that are different will be transferred.

RDC can be integrated into the gateway or into the server. RDC can either be used during the communication between the roaming client and the Anywhere Access Gateway or the Anywhere Access Gateway can simply pass the raw communication traffic to the backend server which then utilizes RDC to determine the blocks to be transferred.

WinFS Sync

WinFS is a new storage system produced by Microsoft Corporation that builds "everyday information" schema describing the items stored in the computer and allows users to organize and relate items based upon attributes represented in the schema. The schema describes real entities such as: Images, Documents, People, Events, Tasks and Messages. These entities are combined in meaningful ways through relationships. WinFS Sync is the technology that replicates items at nearly full-fidelity between multiple systems arranged in a configurable topology. When WinFS detects that a change has been made to item, WinFS replicates the updated item to the other servers.

In this case, assume that WinFS Sync has been used to replicate a new object, Object $O_B$, from Machine A to Machine B in such a manner that Object $O_B$ is now identical on each machine. If the object on Machine A is then modified, Machines A and B have two different incarnations of the same resource, Object $O_A$ and Object $O_B$, respectively. Machine B holds the old version, while Machine A holds the new version that is a slight (or incremental) edit of the content of Object $O_B$.

Without RDC, Object $O_A$ would be copied in its entirety to Machine B irrespective to the amount of data that was actually modified. By introducing RDC, however, only the chunks of Object $O_A$ that contain data that has been modified must be transferred. This reduces the amount of data transferred and increases the speed of replication over slow links by not resending data that is identical between Object $O_A$ and Object $O_B$.

Transferring Files to Devices with Slow Connections

Cell phones and other handheld devices continue to add new functionality in order to keep users connected. Features such as internet access, e-mail access, and sending and receiving photos are now common place on these devices. The storage capacity of these devices is expected to continue to increase significantly over the next few years. The problem is that these types of operations are bandwidth intensive and even the highest speed cell networks are still only in the 100 to 200 kbps range. This problem can be overcome by either increasing the bandwidth available or by better utilizing the bandwidth that is already available. The former requires upgrading the networks which is extremely expensive and time consuming. The latter can be accomplished using RDC.

RDC can improve downloading content to these devices by utilizing as much of the data that already exists on the phone to construct the new objects that are being downloaded. RDC can also improve the experience with uploading information as well. In this case, chunks may be utilized on the destination server in order to reduce the amount of data that the device must transfer. The benefits to using RDC in this application are similar to those described in the second scenario of the File Copying between Machines application.

Improving Binary Updates

Figure 26:
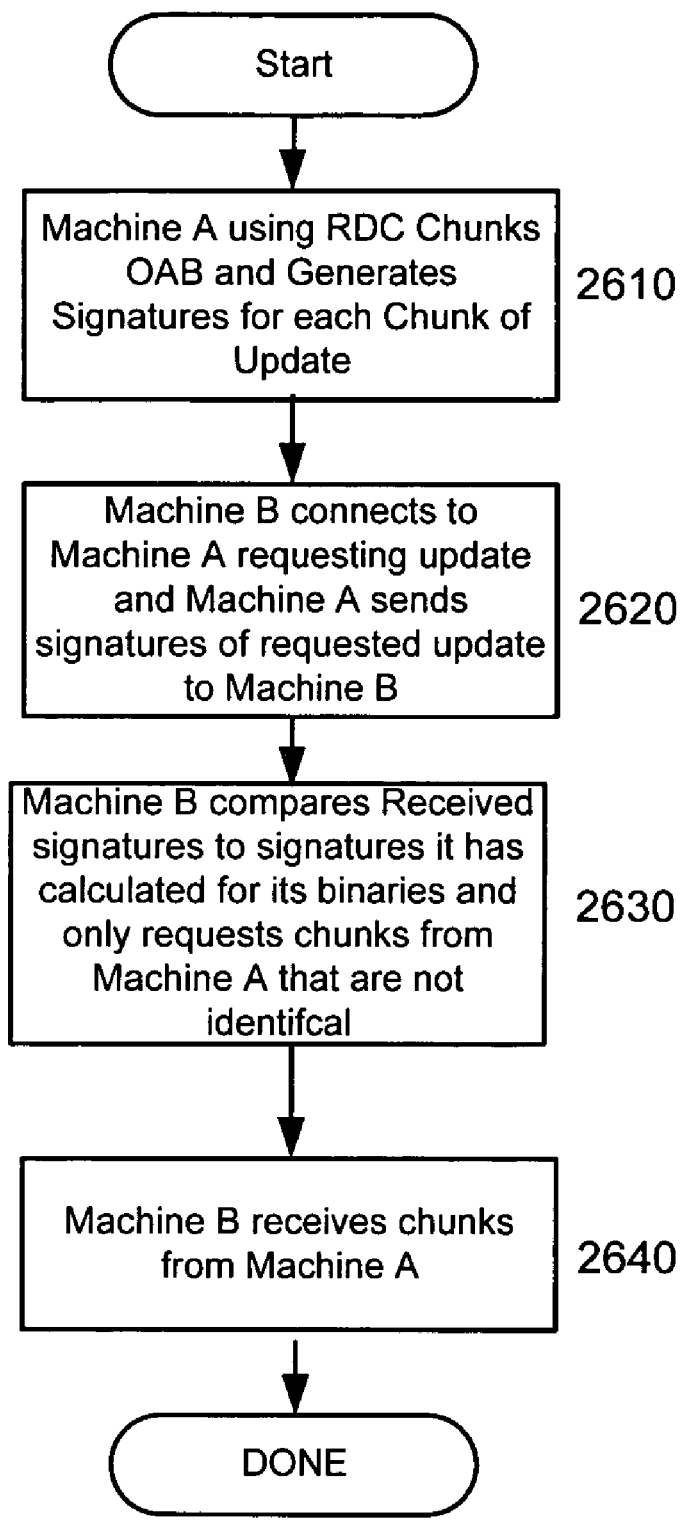
FIG. 26 shows a process for updating binaries.

FIG. 26 shows a process for updating binaries, in accordance with aspects of the present invention. Binary differencing is used to precisely determine all of the bytes that differ between two versions of a binary file (e.g. an executable, a DLL). An application of this is to create binary patches that when applied will make the two versions equivalent. Update programs may use this technique to substantially reduce the amount of data that a user must download when updating their computer. For each update, patches are statically created for every version of the existing binaries that must be updated. When users then download the update, they really are downloading the optimal patch between their existing binary and the update that has been created previously.

This method has a few limitations. First, all of the patches must be statically created prior to distribution which is a time and hardware intensive process. It can take days to create all of the patches which then must be stored and maintained. Second, if the user has a version of the binary that is not recognized (and therefore no patch exists for that version) the entire updated binary must be downloaded. RDC can be used to offset these limitations by having the clients participate in the differencing calculations and performing the differencing in real time.

In this case, assume that a new object, Object $O_A$, has been placed on Machine A (the update server) for which a client machine, Machine B, has a previous version, Object $O_B$, that must be updated. Machine B holds an old version, while Machine A holds a version that has been patched.

Before RDC, a patch would be created by statically comparing Object $O_A$ and Object $O_B$ on Machine A. If Object $O_B$ did not exist, no patch could be created and Object $O_A$ would be copied in its entirety to Machine B, irrespective to the amount of data that was actually modified. Otherwise, when a client, Machine B, requests Object $O_A$, Machine B first determines (based on the version of their Object $O_B$) what patch needs to be downloaded from Machine A. Machine B then downloads the patch that can be applied to Object $O_B$ in order to generate Object $O_A$.

By introducing RDC, only the signature file for Object $O_A$ must be calculated on Machine A (2610). There is no need to maintain Object $O_B$ or a history of patches. When a client, Machine B, requests Object $O_A$ they will be sent the statically generated signature file (2620) from which the client can determine which chunks of Object $O_A$ are needed (2630). These chunks can then be requested and downloaded (2640). This reduces the amount of data transferred by not resending data that is identical between Object $O_A$ and Object $O_B$ without requiring patches being generated for every version of Object $O_B$.

Transferring Backup Images

Backup applications, such as Data Protection Server (DPS), are used to create disk based backups. Using DPS as an example, an agent is installed on the production servers that sends continuous updates back to the DPS server using a filter driver. These updates are at the block level and include all changes made to any files or folders on the production servers that the user or an administrator has decided to protect. The DPS server then creates snapshots of these updates at scheduled intervals and stores them so that the data may be restored at a later time.

One limitation of this technique is that more data may be sent to the DPS server than required, for example in cases in which a temporary file is used during editing and then renamed to replace the original when the user chooses to save the item. This limitation could be reduced if RDC were used during the replication. Another limitation of the DPS technique is manifested when an application creates a temporary file that is later discarded; the DPS replicates the entire temporary file although this file later gets deleted.

When using RDC, instead of sending continuous updates using the filter driver, the DPS agent would periodically take snapshots on the production servers and generate a local backup file. This backup file would then be transferred using RDC to the DLS server in the same manner as described in the File Copying between Machines application; the previous version of the backup file that is already stored on the DLS server can be used for the differential transfer. After the differential transfer completes, the previous version may be discarded. While this does not provide for continuous updates, it may actually transfer less data than the current method, as the optimizations that can be performed by the driver are restricted in the method that does not use RDC. This reduces the amount of data transferred and increases the speed of replication to the DPS server over slow links by not resending data that is identical between the backup files that are generated.

Package Distribution

With the proliferation of servers and applications, it is increasingly difficult to stay up-to-date on the latest updates needed within the enterprise. One example of staying up to date is using the Systems Management Server (SMS) 2003 that provides enhanced awareness of the latest Microsoft updates for configured systems, enabling enterprises to stay one step ahead of vulnerabilities. Updates are then automatically downloaded from the Microsoft Web site, packaged, and targeted for distribution to a collection of systems identified earlier.

RDC can be integrated with the update server in order to reduce the bandwidth required to distribute these updates to the individual client machines. In this case, assume that a new object, Object $O_A$, has been placed on Machine A for which a client machine, Machine B, has a previous version, Object $O_B$, that must be updated. Machine B holds an old version, while Machine A holds a version that has been patched.

Before RDC, Object $O_A$ would be copied in its entirety to Machine B irrespective to the amount of data that was actually modified.

By introducing RDC, only the signature file for Object $O_A$ must be calculated on Machine A. When a client, Machine B, requests Object $O_A$ they will be sent the statically generated signature file from which the client can determine which parts of Object $O_A$ are needed. These parts can then be requested and downloaded. This reduces the amount of data transferred by not resending data that is identical between Object $O_A$ and Object $O_B$ without requiring patches being generated for every version of Object $O_B$.

Peer-to-Peer Cache for Distribution of Content Such as Software Updates

Figure 27:
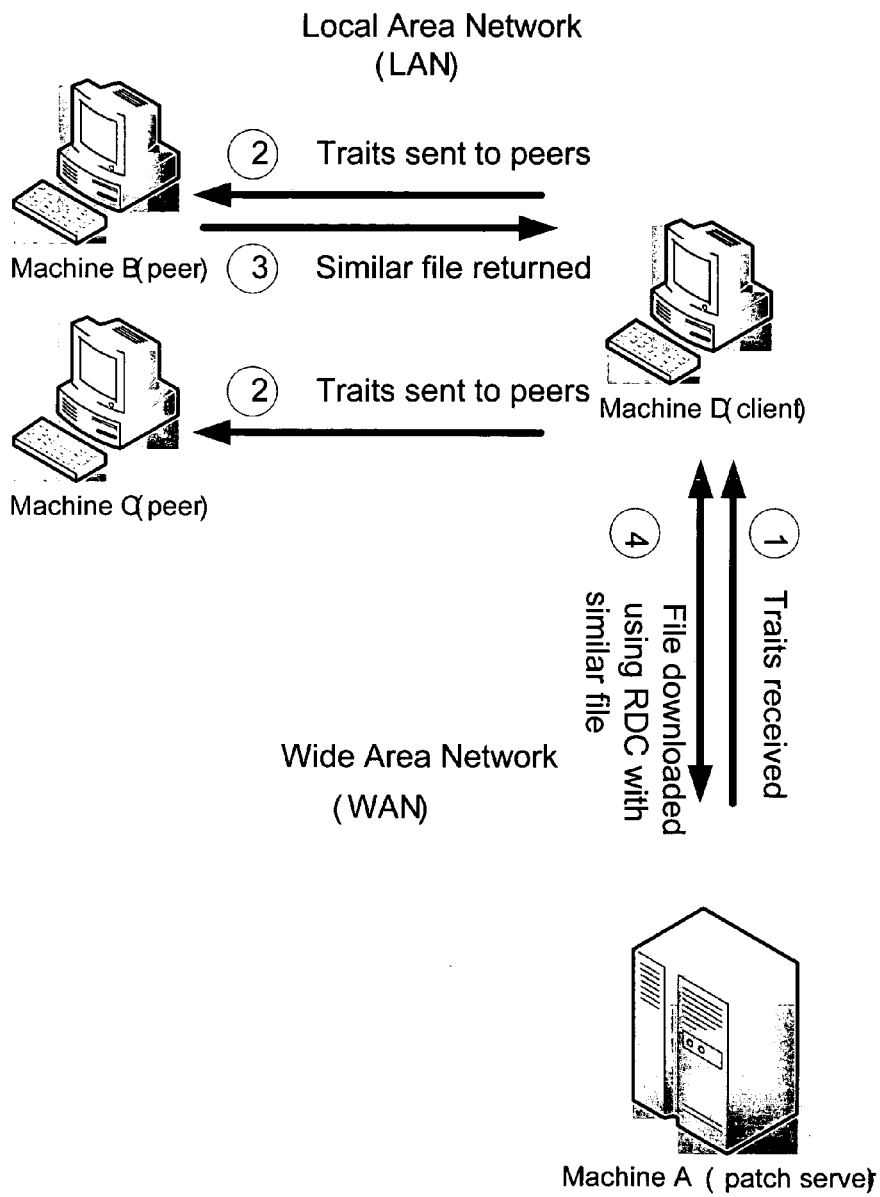
FIG. 27 illustrates using RDC in a peer-to-peer cache for retrieval and distribution of content.

FIG. 27 illustrates using RDC in a peer-to-peer cache for distribution of content, in accordance with aspects of the present invention. Using the similarity functionality described herein, a peer-to-peer cache for the distribution of content such as software updates, training materials, media files, etc, may be created. The premise in general is to utilize similar content that already exists on the LAN in order to download new content with RDC over the WAN. Referring to FIG. 27, the base scenario involves a small number of machines (Machine B, Machine C, Machine D) on a local area network and a content server (Machine A) located on a wide area network; in the case of software updates, the content server would be a patch server, e.g. running Windows Update Service (WUS). Machine D is the client machine that is downloading the new content, Object $O_A$, Machine A is the server that contains Object $O_A$, and Machine B contains some content, Object $O_B$, which is similar or even identical to the one being downloaded. The protocol for transferring the updated Object $O_A$ from Machine A to Machine D proceeds using the following steps:

1) Machine D requests the set of similarity traits for Object $O_A$ from Machine A. Machine A returns these traits to Machine D. Since the set of traits is very small, this step requires only a very small, fixed amount of data to be sent over the WAN.

2) Machine D broadcasts the traits received from Machine A to the other computers on the local area network (Machine B and Machine C in this instance) and waits for a response.

If no response is received by Machine D after some set time interval, Machine D assumes none of the other machines on the LAN has similar content or is available to help with the download, so it skips steps 4 and 5 below and just downloads the entire content Object $O_A$ from Machine A.

3) Machine B and Machine C determine if they have similar patches based on the traits they received from Machine D. In this example, Machine B has a match and returns the similar object, Object $O_B$, to Machine D. In a different case, more than one machine on the LAN could respond to Machine D's request and supply portions of the Object $O_A$ to be downloaded.

4) Machine D then uses Object $O_B$ as the local object in order to download Object $O_A$ using RDC across the WAN.

This technique is resilient to slight differences in patches on the other machines or to corruption in the patches since the machine performing the download will only use chunks from existing patches from its peers for which the signature matches exactly. The benefits gained from Step 4 are identical to those previously described in the File Copying between Machines application.

Protocol Integration

In addition to integrating RDC on the application level, it can also be integrated into the various transfer protocols including, but not limited to: SOAP, SMB, HTTP, FTP, WebDAV, NFS, SIP, MSNP, MAPI, POP, and IMAP. Integrating RDC into the protocols will allow applications to benefit without the need to modify the applications themselves.

In this case, the APIs through which the protocols are exposed would remain consistent but their implementation and the protocols themselves would be enhanced to automatically utilize RDC with existing objects whenever possible to reduce the raw amount of data that must be transferred. The benefits to using RDC in this application are identical to those described in the File Copying between Machines application, but of course are not limited to files only.

Specific examples where improvements would immediately be seen include: Web page downloads; File transfers to and from Microsoft Share Point sites; File transfers to and from various network sites; File transfers performed by various applications; and Transfers of XML data between various Web services. For instance, updates of a customer or SKU list that are transferred as XML.

Source Control Systems

With source control systems, a database is used to track, organize, and manage "projects." These projects are a unit of organization, like a folder, and can contain various kinds of files (items), including code and documentation. This version control enables users to more flexibly manage the contents of projects (for example, to include only items labeled as a "release" version of the application) and manage project history (to restore an older version, for example, for testing or re-release). CVS, RCS, IBM/Rational's ClearCase, Microsoft's Visual SourceSafe and Source Depot are a few such systems, as are any document management applications.

In general, users 'check-in' files to the source control system in order to add or update files. They will then 'sync' their local source repository with the source control system in order to download all of the updates that other users have checked in. Many of these updates will simply be edits to existing files that are already contained in the local repository. RDC can be used to improve this synchronization process, especially with large binaries that are checked into the system.

The 'check-in' process is similar to the File Replication Service application in which the source code control system that requires updating resides on Machine B and the most recent versions of the objects are located on Machine A. The 'sync' process is similar to the File Replication Service application in which the source code control system resides on Machine A and contains the most recent versions of the objects and Machine B is the client machine that contains the local repository that requires updated. The benefits gained are similar to those described in the File Replication Service application.

Many document management systems (DMS) that operate in a branch office type scenario (the central office has the File Server and DMS server managing the files, and users at remote offices, often with significantly low bandwidth, access the files on a regular basis) utilize a local caching algorithm for the client machines in remote offices. In general, when a user accesses a DMS'd document, the file will be copied to the client machine (RDC operations here, perhaps cross file RDC) and subsequently edited and then later 'checked-in.' At this point the DMS client retains a local copy of the file as opposed t o deleting the file. Therefore, when the user wishes to edit the same file again and there have been no updates according to the DMS server the initial file download is circumvented. If there were updates and the local cached copy is not current then RDC can be used to transfer the recent version.

Content Downloads for Online Games

Content Download allows users to download new content directly from a service. One such service is the Xbox Live service that allows a user to download content straight onto the Xbox hard disk without needing to go to the store or to a separate web site. The content may be downloaded to any gaming system whether it be a console type gaming system or a gaming running on a personal computer. Content may include many different types of data, including but not limited to things such as new cars and tracks for racing games, weapons, skins, and maps for first-person shooter enthusiasts, new civilizations and technologies for strategy games and more, as well as receiving updates.

RDC can be used to improve the Content Download experience by exploiting the similarities between the existing content and the content downloaded to augment it. It should also be noted that updates to the gaming software or firmware itself can also be transferred more efficiently by using RDC in a similar manner.

In this case, assume that Content Download has been used to copy a new object, Object O, from the Content Download server, Machine A, to Machine B, on which Object O does not already exist. Also assume that Object P exists on Machine B and is somewhat similar to Object O (meaning some of the chunks in Object O have corresponding chunks in Object P). For greater efficiency, chunks could potentially be used from multiple objects on Machine B if desired.

Before RDC, Object O would be copied in its entirety to Machine B. By introducing RDC and utilizing the chunks found in Object P, only the chunks of Object O that are unique to Object O must be transferred. This reduces the amount of data transferred and increases the speed of the copy over slow links by not resending data that is identical between Object O and Object P.

Using RDC in a Disconnected Environment

Figure 28:
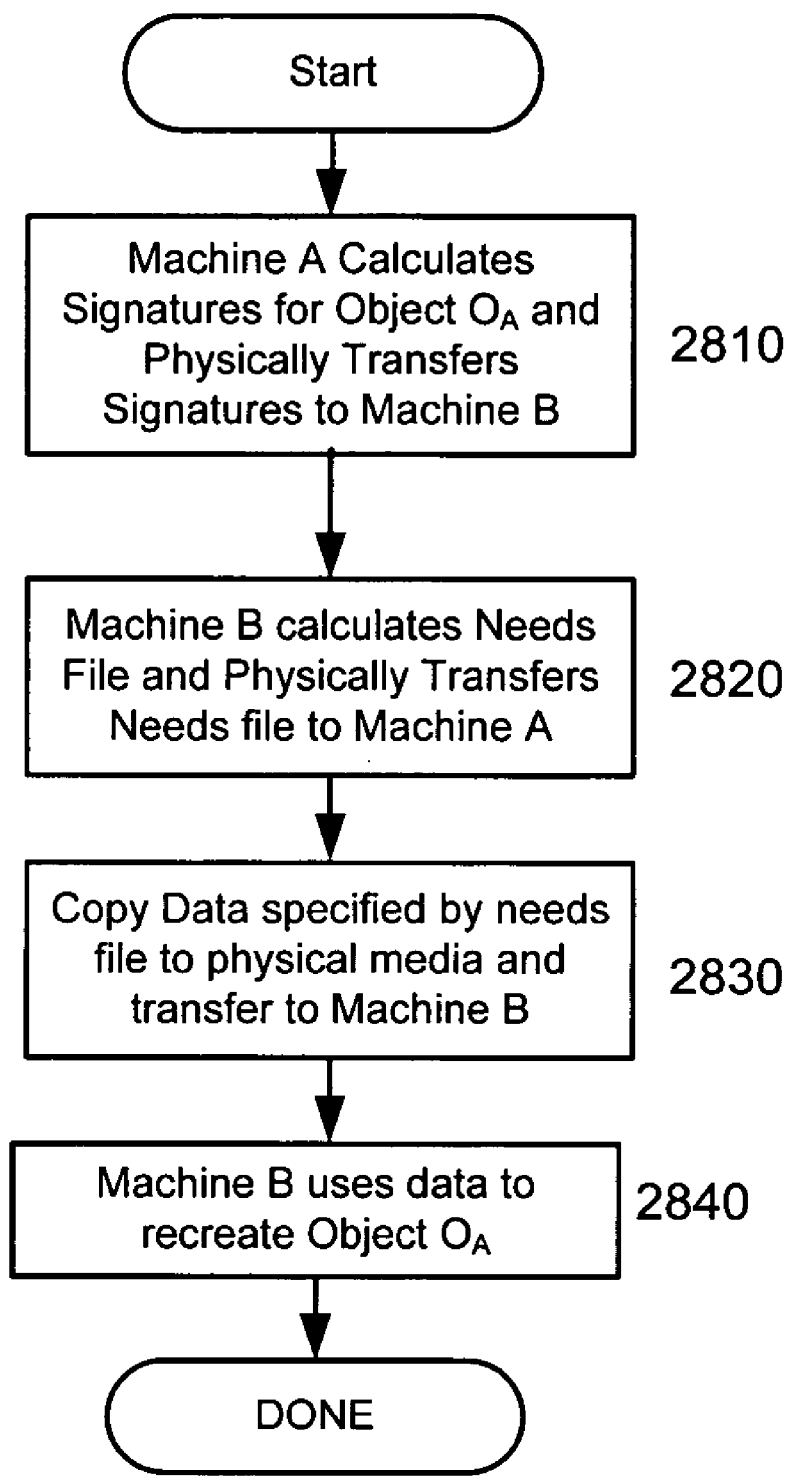
FIG. 28 shows a process for using RDC in a disconnected environment.

FIG. 28 shows a process for using RDC in a disconnected environment, in accordance with aspects of the present invention. RDC is flexible enough so that it is not required to be performed in an on-line environment. It can also be used to efficiently transfer files between machines that are not on the same network. For example, RDC can be used to help transfer a 2 GB Virtual PC image (stored as a VHD file) update between two machines that lack a physical network connection. Without RDC, the transfer would either require a DVD-R, multiple CD-Rs, or thousands of floppy disks. Depending on the amount of similarity, this can be drastically reduced with RDC.

In this case, assume that Machines A and B have two different incarnations of the same resource, Object $O_A$ and Object $O_B$, respectively and that the machines are not connected over a network in any manner. Machine B holds an old version, while Machine A holds a version that is a slight (or incremental) update of the content.

Before RDC, Object $O_A$ would be copied in its entirety to a medium (such as DVD-ROM, CD-ROM, floppy disks, USB sticks, etc.) that would have to be physically transported to Machine B; the entire data of Object $O_A$ would need to be included on the medium, irrespective to the amount of data that was actually modified compared to Object $O_B$. By introducing RDC, however, only the chunks of Object $O_A$ that contain data that has been modified must be transferred. This can be done as follows:

Signatures for Object $O_A$ are calculated and stored on some form of physical media and physically transferred to Machine B (2810).

Machine B then calculates the signatures for Object $O_B$ and calculates the needs file (a listing of the actual data that must be copied). The needs file is copied to some form of physical media and transferred to Machine A (2820).

Finally, the data specified by the needs file is copied to physical media on Machine A and transferred to Machine B (2830) where it is used in conjunction with the data of Object $O_B$ to recreate Object $O_A$ (2840). Additionally, at any step the process could continual normally if a network connection was made available.

In an alternate embodiment, the number of physical media transfer steps required to perform the transfer can be reduced as follows:

Machine B calculates the signatures for Object $O_B$ and stores these in a file, which is copied to some form of physical media and physically transferred to Machine A.

Machine A calculates the signatures for Object $O_A$ and compares them to the signatures of Object $O_B$ received on the physical media. Based on this calculation, Machine A can determine the chunks of Object $O_A$ that are not included in Object $O_B$ and are thus needed by Machine B. The list of signatures of Object $O_A$ and the needed chunks are included as files and stored on physical media. The media is then physically transferred to Machine B.

Finally, Machine B uses the received data to recreate Object $O_A$.

Updating Antivirus Signatures

Many companies produce antivirus applications, each of which attempts to protect the host computer with minimal inconvenience to and interaction with end users. Most of these applications have become very effective in providing this protection, but they all require frequent updates to keep up with new malware. These updates are generally delivered by means of signature files. These signature files can be quite large and take a considerable amount of time to download over slow links. The benefits of using RDC in this application are identical to those described in the File Copying between Machines application. In this case, Machine A is the server hosting the updated signature files and Machine B is the client receiving the updates.

Use of RDC for Local File System Compression

Figure 29:
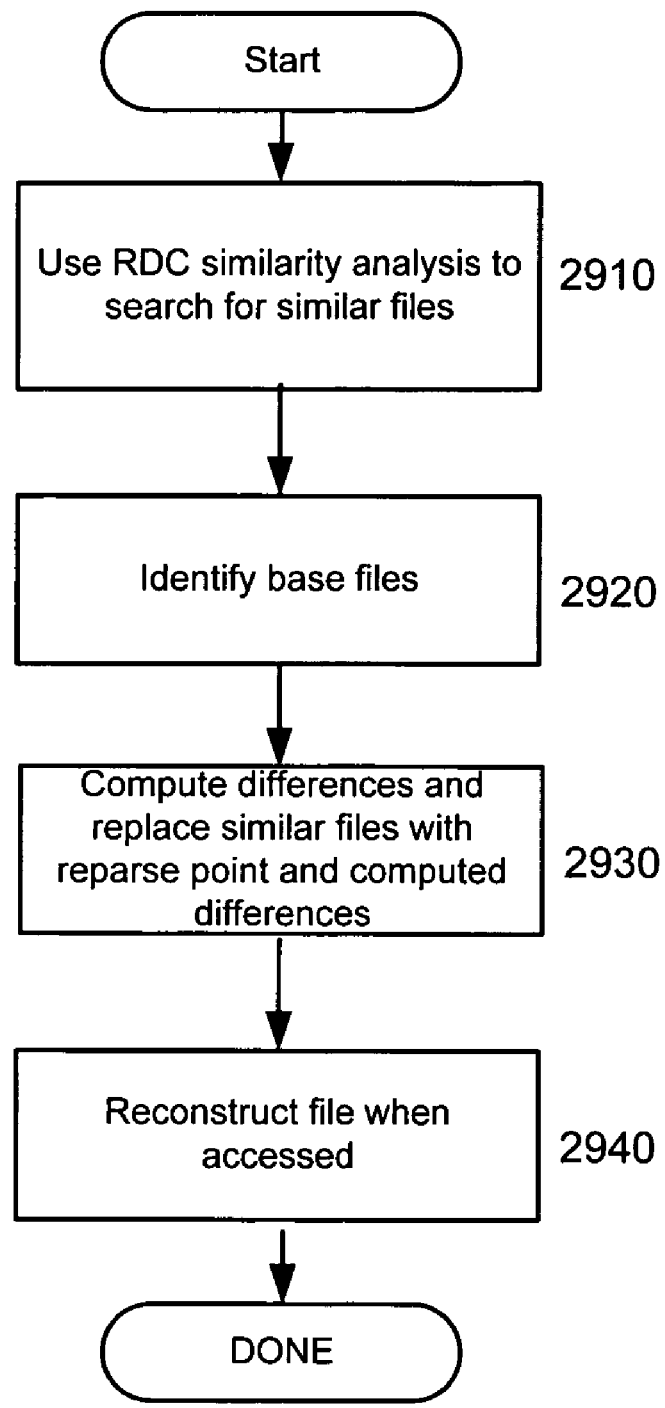
FIG. 29 illustrates a process for using RDC in local file system compression, in accordance with aspects of the present invention.

FIG. 29 illustrates a process for using RDC in local file system compression, in accordance with aspects of the present invention. RDC is typically used to compress data transferred to remote servers by comparing differences between files and transferring only the changed parts. This same concept could also be used to compress the local file system and may be particularly useful in archival scenarios where multiple versions of files with incremental changes are maintained. One example might include a revision control system storing binary data. Other ad hoc scenarios such as a user saving multiple versions of the same document could also benefit from RDC compression in the local file system. Also, depending on how similar files are in a typical local file system, RDC compression may be helpful in the general case.

Compression is expected to be adaptive and be running in the background. A service could use RDC similarity analysis to search the local file system and find files that are similar (2910). A set of the most useful base files could be identified (2910). The similar files would then have their differences computed from these base files and their data would be replaced with an NTFS reparse point and the differences (2930).

When files are accessed, the filter driver reconstructs the file (2940). This is done by using the base files and the saved RDC difference data. The whole file is then reconstructed and the reparse point replaced, or data could be streamed directly to the application as it is reconstructed. Optimizations are possible depending on how the file was opened. One can envision reconstructing the entire file, and then upon a close, re-computing the RDC differences and truncating the file to a reparse point again.

In a dynamic file system environment, the "best" files to use as the seed files may change. This pool of seed files would need to be managed so that files are added and removed to optimize either fast access to files or optimize compression. In isolated cases, such as revision control systems, optimizing compression would likely be preferred.

As the files get older, a service can initiate the RDC compression and replacement of the file data with a reparse point and the differences.

Operating Environment

FIG. 1 is a diagram illustrating an example operating environment for the present invention. As illustrated in the figure, devices are arranged to communicate over a network. These devices may be general purpose computing device, special purpose computing devices, or any other appropriate devices that are connected to a network. The network 102 may correspond to any connectivity topology including, but not limited to: a direct wired connection (e.g., parallel port, serial port, USB, IEEE 1394, etc), a wireless connection (e.g., IR port, Bluetooth port, etc.), a wired network, a wireless network, a local area network, a wide area network, an ultra-wide area network, an internet, an intranet, and an extranet.

In an example interaction between device A (100) and device B (101), different versions of an object are locally stored on the two devices: object $O_A$ on 100 and object $O_B$ on 101. At some point, device A (100) decides to update its copy of object $O_A$ with the copy (object $O_B$) stored on device B (101), and sends a request to device B (101) to initiate the RDC method. In an alternate embodiment, the RDC method could be initiated by device B (101).

Device A (100) and device B (101) both process their locally stored object and divide the associated data into a variable number of chunks in a data-dependent fashion (e.g., chunks 1-n for object $O_B$, and chunks 1-k for object $O_A$, respectively). A set of signatures such as strong hashes (SHA) for the chunks are computed locally by both the devices. The devices both compile separate lists of the signatures. During the next step of the RDC method, device B (101) transmits its computed list of signatures and chunk lengths 1-n to device A (100) over the network 102. Device A (100) evaluates this list of signatures by comparing each received signature to its own generated signature list 1-k. Mismatches in the signature lists indicate one or more differences in the objects that require correction. Device A (100) transmits a request for device B (101) to send the chunks that have been identified by the mismatches in the signature lists. Device B (101) subsequently compresses and transmits the requested chunks, which are then reassembled by device A (100) after reception and decompression are accomplished. Device A (100) reassembles the received chunks together with its own matching chunks to obtain a local copy of object $O_B$.

Example Computing Device

Figure 2:
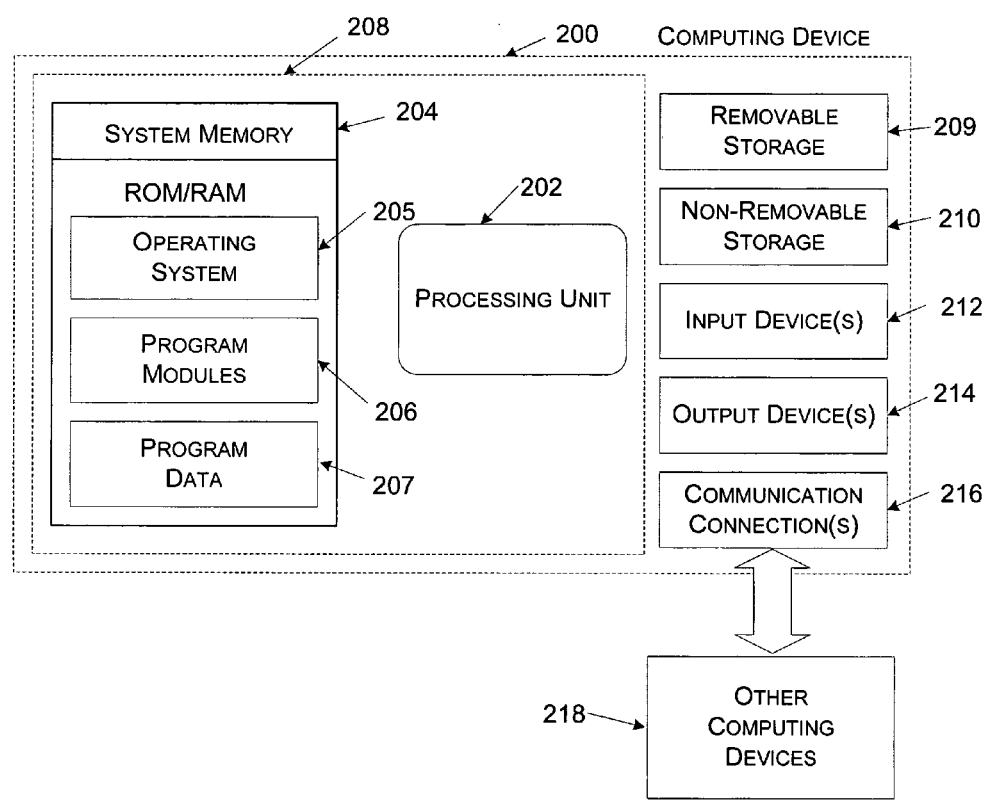
FIG. 2 is a diagram illustrating an example computing device.

FIG. 2 is a block diagram of an example computing device that is arranged in accordance with the present invention. In a basic configuration, computing device 200 typically includes at least one processing unit (202) and system memory (204). Depending on the exact configuration and type of computing device, system memory 204 may be volatile (such as RAM), non-volatile (such as ROM, flash memory, etc.) or some combination of the two. System memory 204 typically includes an operating system (205); one or more program modules (206); and may include program data (207). This basic configuration is illustrated in FIG. 2 by those components within dashed line 208.

Computing device 200 may also have additional features or functionality. For example, computing device 200 may also include additional data storage devices (removable and/or non-removable) such as, for example, magnetic disks, optical disks, or tape. Such additional storage is illustrated in FIG. 2 by removable storage 209 and non-removable storage 210. Computer storage media may include volatile and non-volatile, removable and non-removable media implemented in any method or technology for storage of information, such as computer readable instructions, data structures, program modules or other data. System memory 204, removable storage 209 and non-removable storage 210 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 200. Any such computer storage media may be part of device 200. Computing device 200 may also have input device(s) 212 such as keyboard, mouse, pen, voice input device, touch input device, etc. Output device(s) 214 such as a display, speakers, printer, etc. may also be included. All these devices are known in the art and need not be discussed at length here.

Computing device 200 also contains communications connection(s) 216 that allow the device to communicate with other computing devices 218, such as over a network. Communications connection(s) 216 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, microwave, satellite, infrared and other wireless media. The term computer readable media as used herein includes both storage media and communication media.

Various procedures and interfaces may be implemented in one or more application programs that reside in system memory 204. In one example, the application program is a remote differential compression algorithm that schedules file synchronization between the computing device (e.g., a client) and another remotely located computing device (e.g., a server). In another example, the application program is a compression/decompression procedure that is provided in system memory 204 for compression and decompressing data. In still another example, the application program is a decryption procedure that is provided in system memory 204 of a client device.

Remote Differential Compression (RDC)

Figure 3A:
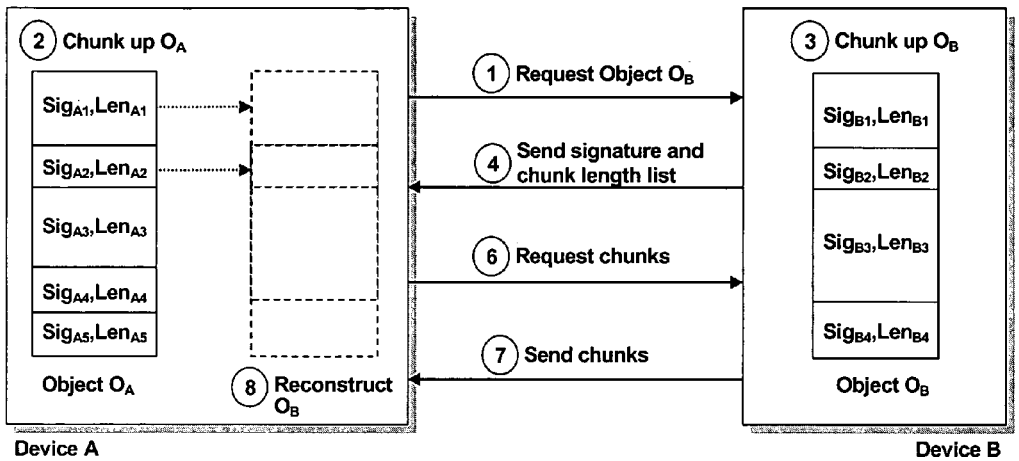
FIGS. 3A and 3B are diagrams illustrating an example RDC procedure.
Figure 3B:
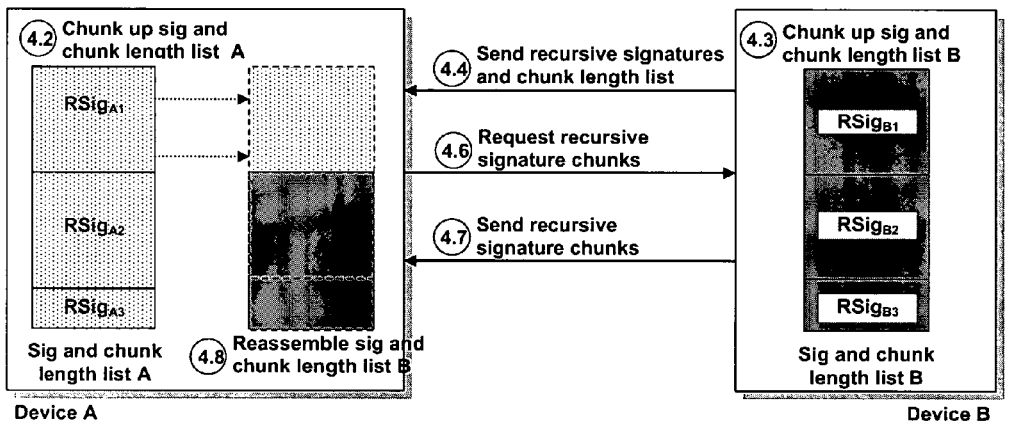

FIGS. 3A and 3B are diagrams illustrating an example RDC procedure according to at least one aspect of the present invention. The number of chunks in particular can vary for each instance depending on the actual objects $O_A$ and $O_B$.

Referring to FIG. 3A, the basic RDC protocol is negotiated between two computing devices (device A and device B). The RDC protocol assumes implicitly that the devices A and B have two different instances (or versions) of the same object or resource, which are identified by object instances (or versions) $O_A$ and $O_B$, respectively. For the example illustrated in this figure, device A has an old version of the resource $O_A$, while device B has a version $O_B$ with a slight (or incremental) difference in the content (or data) associated with the resource.

The protocol for transferring the updated object $O_B$ from device B to device A is described below. A similar protocol may be used to transfer an object from device A to device B, and that the transfer can be initiated at the behest of either device A or device B without significantly changing the protocol described below.

1. Device A sends device B a request to transfer Object $O_B$ using the RDC protocol. In an alternate embodiment, device B initiates the transfer; in this case, the protocol skips step 1 and starts at step 2 below.
2. Device A partitions Object $O_A$ into chunks 1-k, and computes a signature $Sig_{Ai}$ and a length (or size in bytes) $Len_{Ai}$ for each chunk 1 ... k of Object $O_A$. The partitioning into chunks will be described in detail below. Device A stores the list of signatures and chunk lengths $((Sig_{A1}, Len_{A1}) \ldots (Sig_{Ak}, Len_{Ak}))$.
3. Device B partitions Object $O_B$ into chunks 1-n, and computes a signature $Sig_{Bi}$ and a length $Len_{Bi}$ for each chunk 1 ... n of Object $O_B$. The partitioning algorithm used in step 3 must match the one in step 2 above.
4. Device B sends a list of its computed chunk signatures and chunk lengths $((Sig_{B1}, Len_{B1}) \ldots (Sig_{Bn}, Len_{Bn}))$ that are associated with Object $O_B$ to device A. The chunk length information may be subsequently used by device A to request a particular set of chunks by identifying them with their start offset and their length. Because of the sequential nature of the list, it is possible to compute the starting offset in bytes of each chunk Bi by adding up the lengths of all preceding chunks in the list.
   In another embodiment, the list of chunk signatures and chunk lengths is compactly encoded and further compressed using a lossless compression algorithm before being sent to device A.
5. Upon receipt of this data, device A compares the received signature list against the signatures $Sig_{A1} \ldots Sig_{Ak}$ that it computed for Object $O_A$ in step 2, which is associated with the old version of the content.
6. Device A sends a request to device B for all the chunks whose signatures received in step 4 from device B failed to match any of the signatures computed by device A in step 2. For each requested chunk Bi, the request comprises the chunk start offset computed by device A in step 4 and the chunk length.
7. Device B sends the content associated with all the requested chunks to device A. The content sent by device B may be further compressed using a lossless compression algorithm before being sent to device A.
8. Device A reconstructs a local copy of Object $O_B$ by using the chunks received in step 7 from device B, as well as its own chunks of Object $O_A$ that matched signatures sent by device B in step 4. The order in which the local and remote chunks are rearranged on device A is determined by the list of chunk signatures received by device A in step 4.

The partitioning steps 2 and 3 may occur in a data-dependent fashion that uses a fingerprinting function that is computed at every byte position in the associated object ($O_A$ and $O_B$, respectively). For a given position, the fingerprinting function is computed using a small data window surrounding that position in the object; the value of the fingerprinting function depends on all the bytes of the object included in that window. The fingerprinting function can be any appropriate function, such as, for example, a hash function or a Rabin polynomial.

Chunk boundaries are determined at positions in the Object for which the fingerprinting function computes to a value that satisfies a chosen condition. The chunk signatures may be computed using a cryptographically secure hash function (SHA), or some other hash function such as a collision-resistant hash function.

The signature and chunk length list sent in step 4 provides a basis for reconstructing the object using both the original chunks and the identified updated or new chunks. The chunks that are requested in step 6 are identified by their offset and lengths. The object is reconstructed on device A by using local and remote chunks whose signatures match the ones received by device A in step 4, in the same order.

After the reconstruction step is completed by device A, Object $O_A$ can be deleted and replaced by the copy of Object $O_B$ that was reconstructed on device A. In other embodiments, device A may keep Object $O_A$ around for potential "reuse" of chunks during future RDC transfers.

For large objects, the basic RDC protocol instance illustrated in FIG. 3A incurs a significant fixed overhead in Step 4, even if Object $O_A$ and Object $O_B$ are very close, or identical. Given an average chunk size C, the amount of information transmitted over the network in Step 4 is proportional to the size of Object $O_B$, specifically it is proportional to the size of Object $O_B$ divided by C, which is the number of chunks of Object B, and thus of (chunk signature, chunk length) pairs transmitted in step 4.

Figure 6:
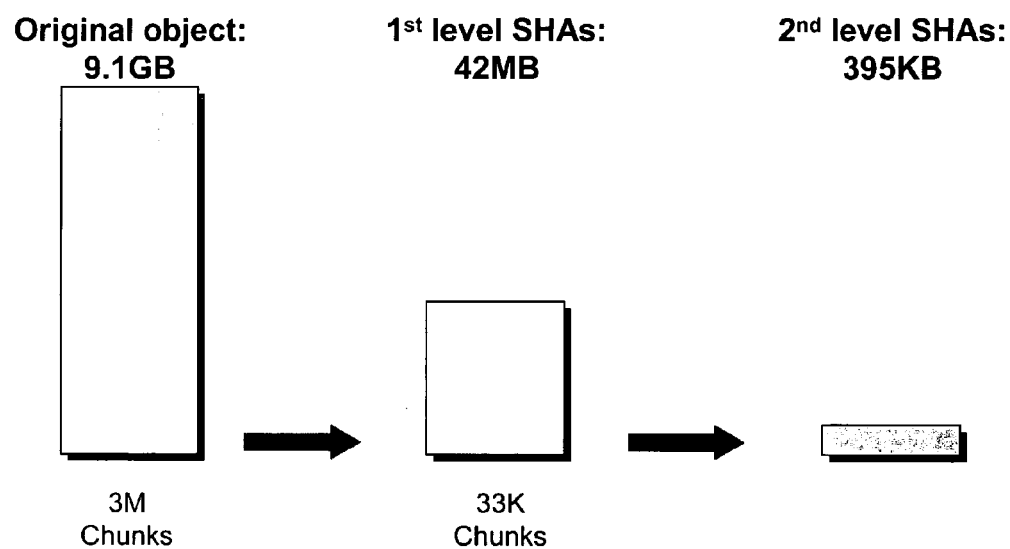
FIG. 6 is a diagram that graphically illustrates an example of recursive compression in an example RDC sequence.

For example, referring to FIG. 6, a large image (e.g., a virtual hard disk image used by a virtual machine monitor such as, for example, Microsoft Virtual Server) may result in an Object ($O_B$) with a size of 9.1 GB. For an average chunk size C equal to 3 KB, the 9 GB object may result in 3 million chunks being generated for Object $O_B$, with 42 MB of associated signature and chunk length information that needs to be sent over the network in Step 4. Since the 42 MB of signature information must be sent over the network even when the differences between Object $O_A$ and Object $O_B$ (and thus the amount of data that needs to be sent in Step 7) are very small, the fixed overhead cost of the protocol is excessively high.

This fixed overhead cost can be significantly reduced by using a recursive application of the RDC protocol instead of the signature information transfer in step 4. Referring to FIG. 3B, additional steps 4.2-4.8 are described as follows below that replace step 4 of the basic RDC algorithm. Steps 4.2-4.8 correspond to a recursive application of steps 2-8 of the basic RDC protocol described above. The recursive application can be further applied to step 4.4 below, and so on, up to any desired recursion depth.

4.2. Device A performs a recursive chunking of its signature and chunk length list $((Sig_{A1}, Len_{A1}) \ldots (Sig_{Ak}, Len_{Ak}))$ into recursive signature chunks, obtaining another list of recursive signatures and recursive chunk lengths $((RSig_{A1}, RLen_{A1}) \ldots (RSig_{As}, RLen_{As}))$, where $s \ll k$.

4.3. Device B recursively chunks up the list of signatures and chunk lengths $((Sig_{B1}, Len_{B1}) \ldots (Sig_{Bn}, Len_{Bn}))$ to produce a list of recursive signatures and recursive chunk lengths $((RSig_{B1}, RLen_{B1})\ldots(RSig_{Br}, RLen_{Br}))$, where $r<<n$.

4.4. Device B sends an ordered list of recursive signatures and recursive chunk lengths $((RSig_{B1}, RLen_{B1})\ldots(RSig_{Br}, RLen_{Br}))$ to device A. The list of recursive chunk signatures and recursive chunk lengths is compactly encoded and may be further compressed using a lossless compression algorithm before being sent to device A.

4.5. Device A compares the recursive signatures received from device B with its own list of recursive signatures computed in Step 4.2.

4.6. Device A sends a request to device B for every distinct recursive signature chunk (with recursive signature $RSig_{Bk}$) for which device A does not have a matching recursive signature in its set $(RSig_{A1}\ldots RSig_{As})$.

4.7. Device B sends device A the requested recursive signature chunks. The requested recursive signature chunks may be further compressed using a lossless compression algorithm before being sent to device A.

4.8. Device A reconstructs the list of signatures and chunk information $((Sig_{B1}, Len_{B1})\ldots(Sig_{Bn}, Len_{Bn}))$ using the locally matching recursive signature chunks, and the recursive chunks received from device B in Step 4.7.

After step 4.8 above is completed, execution continues at step 5 of the basic RDC protocol described above, which is illustrated in FIG. 3A.

As a result of the recursive chunking operations, the number of recursive signatures associated with the objects is reduced by a factor equal to the average chunk size C, yielding a significantly smaller number of recursive signatures ($r<<n$ for object $O_A$ and $s<<k$ for object $O_B$, respectively). In one embodiment, the same chunking parameters could be used for chunking the signatures as for chunking the original objects $O_A$ and $O_B$. In an alternate embodiment, other chunking parameters may be used for the recursive steps.

For very large objects the above recursive steps can be applied k times, where $k \geq 1$. For an average chunk size of C, recursive chunking may reduce the size of the signature traffic over the network (steps 4.2 through 4.8) by a factor approximately corresponding to $C^k$. Since C is relatively large, a recursion depth of greater than one may only be necessary for very large objects.

In one embodiment, the number of recursive steps may be dynamically determined by considering parameters that include one or more of the following: the expected average chunk size, the size of the objects $O_A$ and/or $O_B$, the data format of the objects $O_A$ and/or $O_B$, the latency and bandwidth characteristics of the network connecting device A and device B.

The fingerprinting function used in step 2 is matched to the fingerprinting function that is used in step 3. Similarly, the fingerprinting function used in step 4.2 is matched to the fingerprinting function that is used in step 4.3. The fingerprinting function from steps 2-3 can optionally be matched to the fingerprinting function from steps 4.2-4.3.

As described previously, each fingerprinting function uses a small data window that surrounds a position in the object; where the value associated with the fingerprinting function depends on all the bytes of the object that are included inside the data window. The size of the data window can be dynamically adjusted based on one or more criteria. Furthermore, the chunking procedure uses the value of the fingerprinting function and one or more additional chunking parameters to determine the chunk boundaries in steps 2-3 and 4.2-4.3 above.

By dynamically changing the window size and the chunking parameters, the chunk boundaries are adjusted such that any necessary data transfers are accomplished with minimal consumption of the available bandwidth.

Example criteria for adjusting the window size and the chunking parameters include: a data type associated with the object, environmental constraints, a usage model, the latency and bandwidth characteristics of the network connecting device A and device B, and any other appropriate model for determining average data transfer block sizes. Example data types include word processing files, database images, spreadsheets, presentation slide shows, and graphic images. An example usage model may be where the average number of bytes required in a typical data transfer is monitored.

Changes to a single element within an application program can result in a number of changes to the associated datum and/or file. Since most application programs have an associated file type, the file type is one possible criteria that is worthy of consideration in adjusting the window size and the chunking parameters. In one example, the modification of a single character in a word processing document results in approximately 100 bytes being changed in the associated file. In another example, the modification of a single element in a database application results in 1000 bytes being changed in the database index file. For each example, the appropriate window size and chunking parameters may be different such that the chunking procedure has an appropriate granularity that is optimized based on the particular application.

Example Process Flow

Figure 4A:
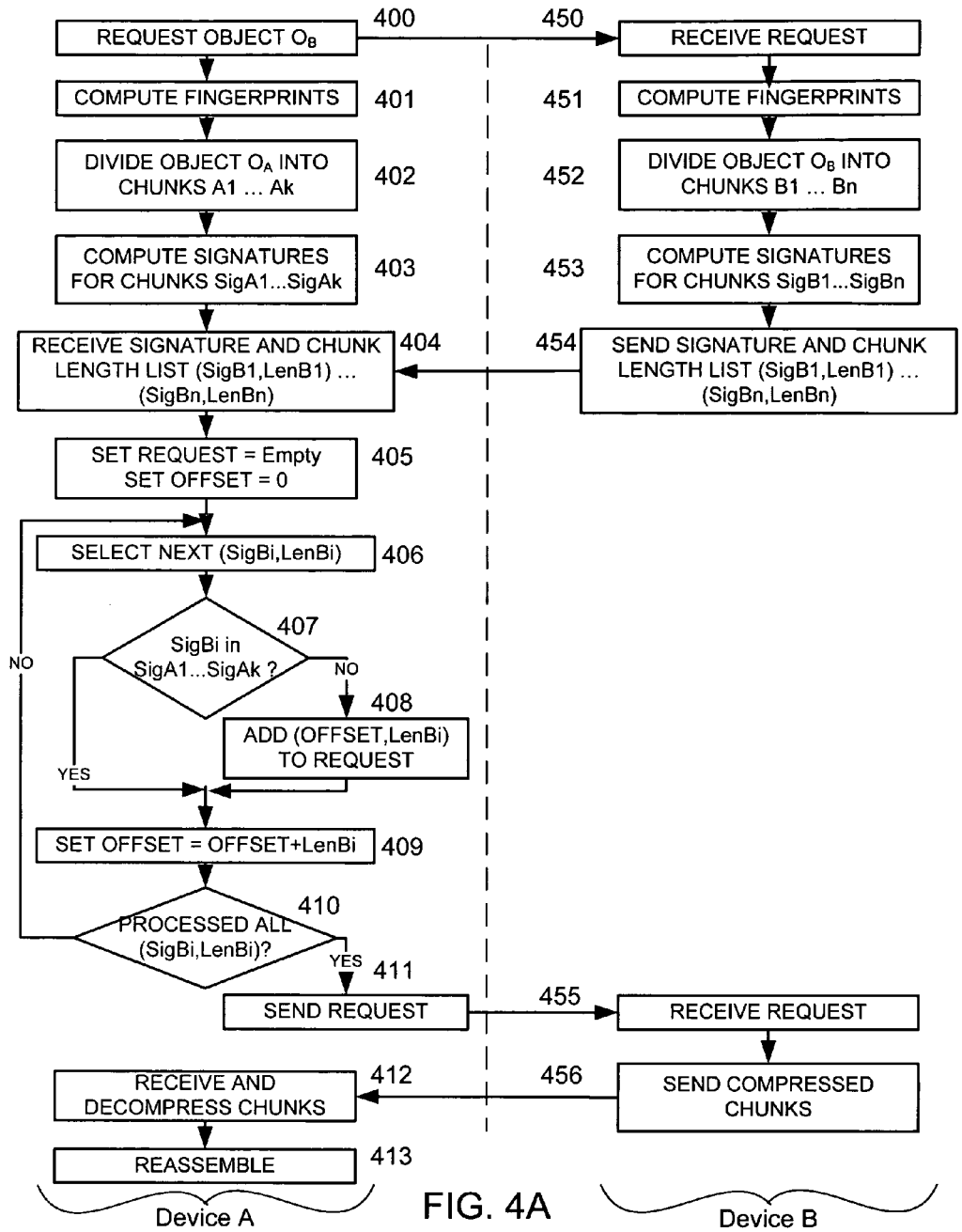
FIGS. 4A and 4B are diagrams illustrating process flows for the interaction between a local device and a remote device during an example RDC procedure.
Figure 4B:
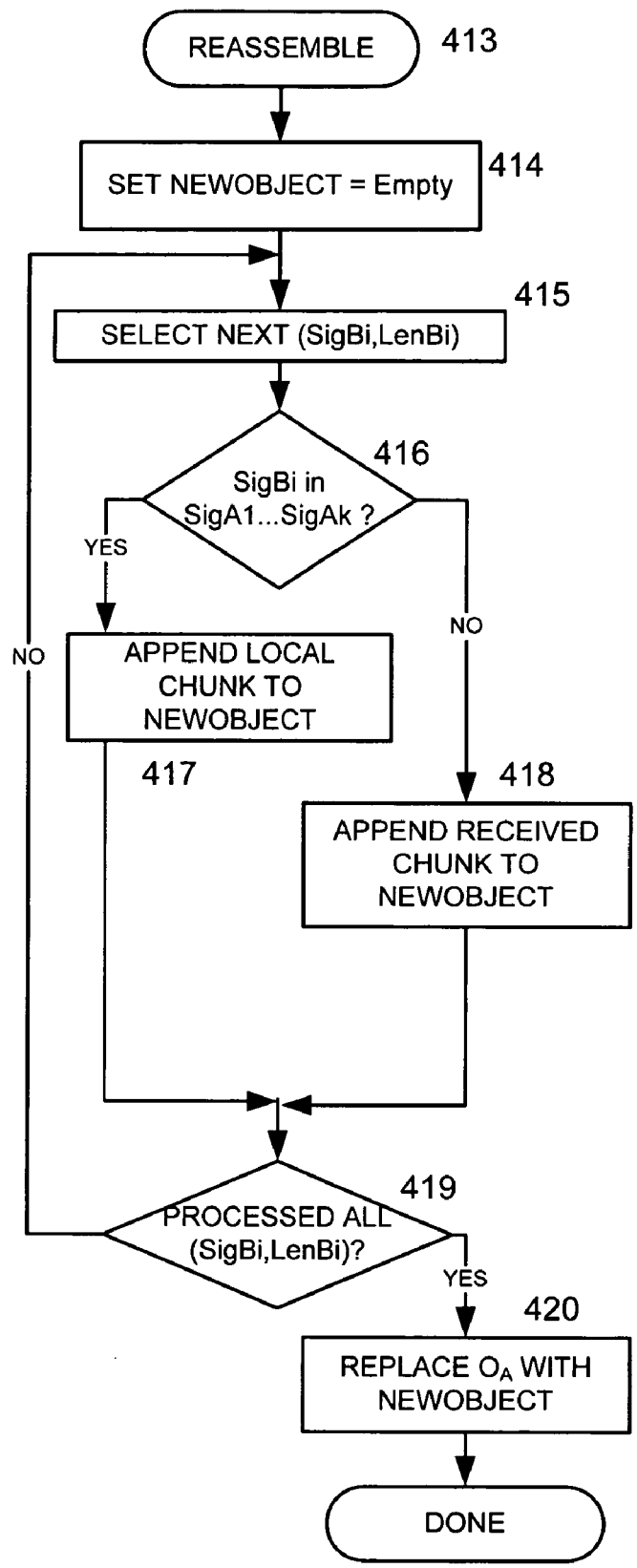

FIGS. 4A and 4B are diagrams illustrating process flows for the interaction between a local device (e.g., device A) and a remote device (e.g., device B) during an example RDC procedure that is arranged in accordance with at least one aspect of the present invention. The left hand side of FIG. 4A illustrates steps 400-413 that are operated on the local device A, while the right hand side of FIG. 4A illustrates steps 450-456 that are operated on the remote device B.

As illustrated in FIG. 4A, the interaction starts by device A requesting an RDC transfer of object $O_B$ in step 400, and device B receiving this request in step 450. Following this, both the local device A and remote device B independently compute fingerprints in steps 401 and 451, divide their respective objects into chunks in steps 402 and 452, and compute signatures (e.g., SHA) for each chunk in steps 403 and 453, respectively.

In step 454, device B sends the signature and chunk length list computed in steps 452 and 453 to device A, which receives this information in step 404.

In step 405, the local device A initializes the list of requested chunks to the empty list, and initializes the tracking offset for the remote chunks to 0. In step 406, the next (signature, chunk length) pair $(Sig_{Bi}, Len_{Bi})$ is selected for consideration from the list received in step 404. In step 407, device A checks whether the signature $Sig_{Bi}$ selected in step 406 matches any of the signatures it computed during step 403. If it matches, execution continues at step 409. If it doesn't match, the tracking remote chunk offset and the length in bytes $Len_{Bi}$ are added to the request list in step 408. At step 409, the tracking offset is incremented by the length of the current chunk $Len_{Bi}$.

In step 410, the local device A tests whether all (signature, chunk length) pairs received in step 404 have been processed. If not, execution continues at step 406. Otherwise, the chunk request list is suitably encoded in a compact fashion, compressed, and sent to the remote device B at step 411.

The remote device B receives the compressed list of chunks at step 455, decompresses it, then compresses and sends back the chunk data at step 456.

The local device receives and decompresses the requested chunk data at step 412. Using the local copy of the object $O_A$ and the received chunk data, the local devices reassembles a local copy of $O_B$ at step 413.

FIG. 4B illustrates a detailed example for step 413 from FIG. 4A. Processing continues at step 414, where the local device A initializes the reconstructed object to empty.

In step 415, the next (signature, chunk length) pair ($Sig_{Bi}$, $Len_{Bi}$) is selected for consideration from the list received in step 404. In step 416, device A checks whether the signature $Sig_{Bi}$ selected in step 417 matches any of the signatures it computed during step 403.

If it matches, execution continues at step 417, where the corresponding local chunk is appended to the reconstructed object. If it doesn't match, the received and decompressed remote chunk is appended to the reconstructed object in step 418.

In step 419, the local device A tests whether all (signature, chunk length) pairs received in step 404 have been processed. If not, execution continues at step 415. Otherwise, the reconstructed object is used to replace the old copy of the object $O_A$ on device A in step 420.

Example Recursive Signature Transfer Process Flow

Figure 5A:
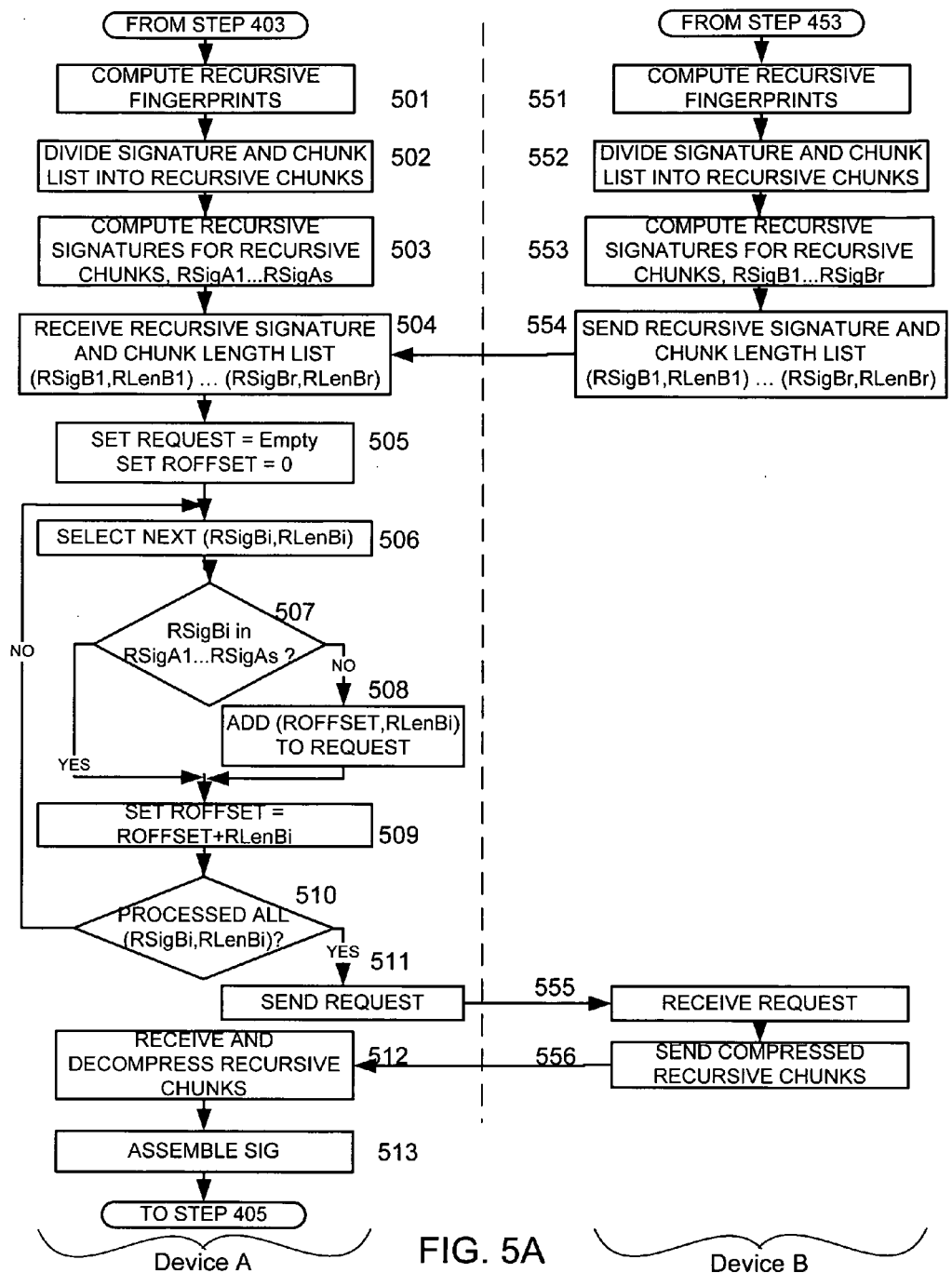
FIGS. 5A and 5B are diagrams illustrating process flows for recursive remote differential compression of the signature and chunk length lists in an example interaction during an RDC procedure.
Figure 5B:
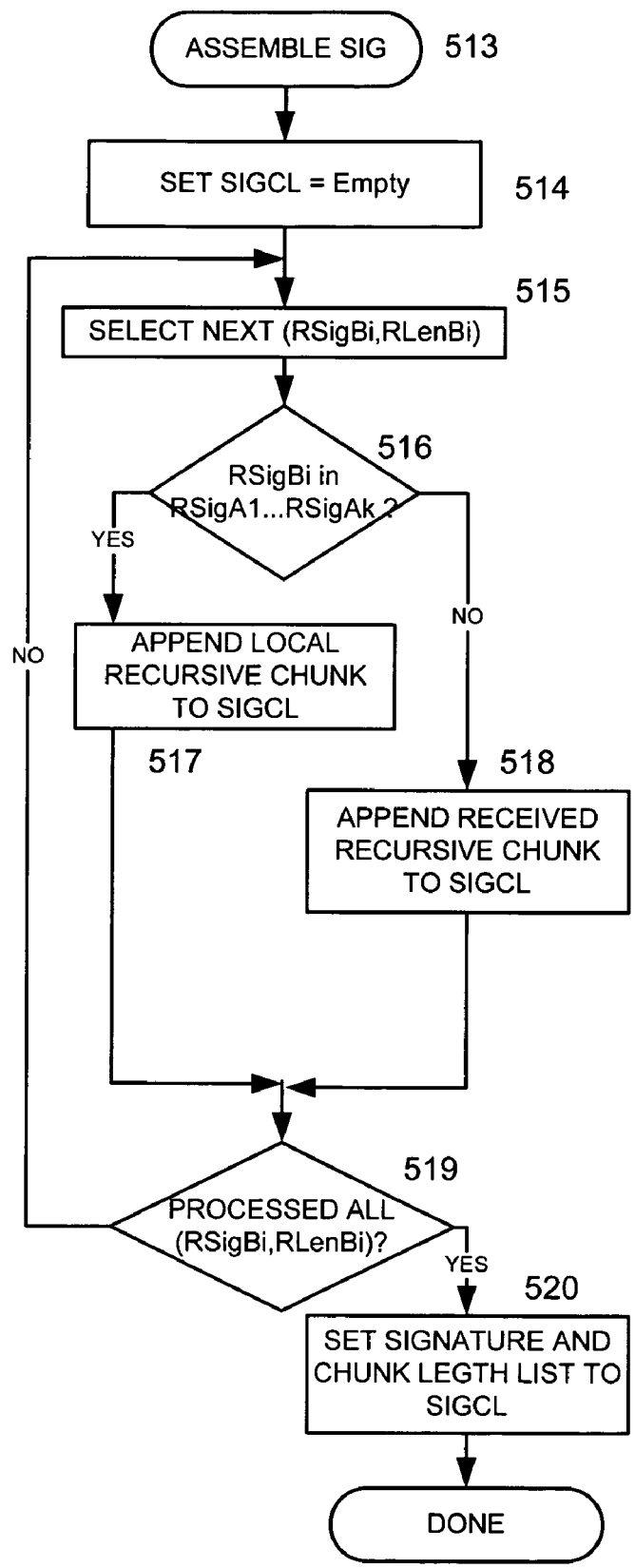

FIGS. 5A and 5B are diagrams illustrating process flows for recursive transfer of the signature and chunk length list in an example RDC procedure that is arranged according to at least one aspect of the present invention. The below described procedure may be applied to both the local and remote devices that are attempting to update commonly associated objects.

The left hand side of FIG. 5A illustrates steps 501-513 that are operated on the local device A, while the right hand side of FIG. 5A illustrates steps 551-556 that are operated on the remote device B. Steps 501-513 replace step 404 in FIG. 4A while steps 551-556 replace step 454 in FIG. 4A.

In steps 501 and 551, both the local device A and remote device B independently compute recursive fingerprints of their signature and chunk length lists (($Sig_{A1}$, $Len_{A1}$), ... ($Sig_{Ak}$, $Len_{Ak}$)) and (($Sig_{B1}$, $Len_{B1}$), ... ($Sig_{Bn}$, $Len_{Bn}$)), respectively, that had been computed in steps 402/403 and 452/453, respectively. In steps 502 and 552 the devices divide their respective signature and chunk length lists into recursive chunks, and in steps 503 and 553 compute recursive signatures (e.g., SHA) for each recursive chunk, respectively.

In step 554, device B sends the recursive signature and chunk length list computed in steps 552 and 553 to device A, which receives this information in step 504.

In step 505, the local device A initializes the list of requested recursive chunks to the empty list, and initializes the tracking remote recursive offset for the remote recursive chunks to 0. In step 506, the next (recursive signature, recursive chunk length) pair ($RSig_{Bi}$, $RLen_{Bi}$) is selected for consideration from the list received in step 504. In step 507, device A checks whether the recursive signature $RSig_{Bi}$ selected in step 506 matches any of the recursive signatures it computed during step 503. If it matches, execution continues at step 509. If it doesn't match, the tracking remote recursive chunk offset and the length in bytes $RLen_{Bi}$ are added to the request list in step 508. At step 509, the tracking remote recursive offset is incremented by the length of the current recursive chunk $RLen_{Bi}$.

In step 510, the local device A tests whether all (recursive signature, recursive chunk length) pairs received in step 504 have been processed. If not, execution continues at step 506. Otherwise, the recursive chunk request list is compactly encoded, compressed, and sent to the remote device B at step 511.

The remote device B receives the compressed list of recursive chunks at step 555, uncompressed the list, then compresses and sends back the recursive chunk data at step 556.

The local device receives and decompresses the requested recursive chunk data at step 512. Using the local copy of the signature and chunk length list (($Sig_{A1}$, $Len_{A1}$), ... ($Sig_{Ak}$, $Len_{Ak}$)) and the received recursive chunk data, the local devices reassembles a local copy of the signature and chunk length list (($Sig_{B1}$, $Len_{B1}$), ... ($Sig_{Bk}$, $Len_{Bn}$)) at step 513. Execution then continues at step 405 in FIG. 4A.

FIG. 5B illustrates a detailed example for step 513 from FIG. 5A. Processing continues at step 514, where the local device A initializes the list of remote signatures and chunk lengths, SIGCL, to the empty list.

In step 515, the next (recursive signature, recursive chunk length) pair ($RSig_{Bi}$, $RLen_{Bi}$) is selected for consideration from the list received in step 504. In step 516, device A checks whether the recursive signature $RSig_{Bi}$ selected in step 515 matches any of the recursive signatures it computed during step 503.

If it matches, execution continues at step 517, where device A appends the corresponding local recursive chunk to SIGCL. If it doesn't match, the remote received recursive chunk is appended to SIGCL at step 518.

In step 519, the local device A tests whether all (recursive signature, recursive chunk length) pairs received in step 504 have been processed. If not, execution continues at step 515. Otherwise, the local copy of the signature and chunk length list (($Sig_{B1}$, $Len_{B1}$), ... ($Sig_{Bk}$, $Len_{Bn}$)) is set to the value of SIGCL in step 520. Execution then continues back to step 405 in FIG. 4A.

The recursive signature and chunk length list may optionally be evaluated to determine if additional recursive remote differential compression is necessary to minimize bandwidth utilization as previously described. The recursive signature and chunk length list can be recursively compressed using the described chunking procedure by replacing steps 504 and 554 with another instance of the RDC procedure, and so on, until the desired compression level is achieved. After the recursive signature list is sufficiently compressed, the recursive signature list is returned for transmission between the remote and local devices as previously described.

FIG. 6 is a diagram that graphically illustrates an example of recursive compression in an example RDC sequence that is arranged in accordance with an example embodiment. For the example illustrated in FIG. 6, the original object is 9.1 GB of data. A signature and chunk length list is compiled using a chunking procedure, where the signature and chunk length list results in 3 million chunks (or a size of 42 MB). After a first recursive step, the signature list is divided into 33 thousand chunks and reduced to a recursive signature and recursive chunk length list with size 33 KB. By recursively compressing the signature list, bandwidth utilization for transferring the signature list is thus dramatically reduced, from 42 MB to about 395 KB.

Example Object Updating

Figure 7:
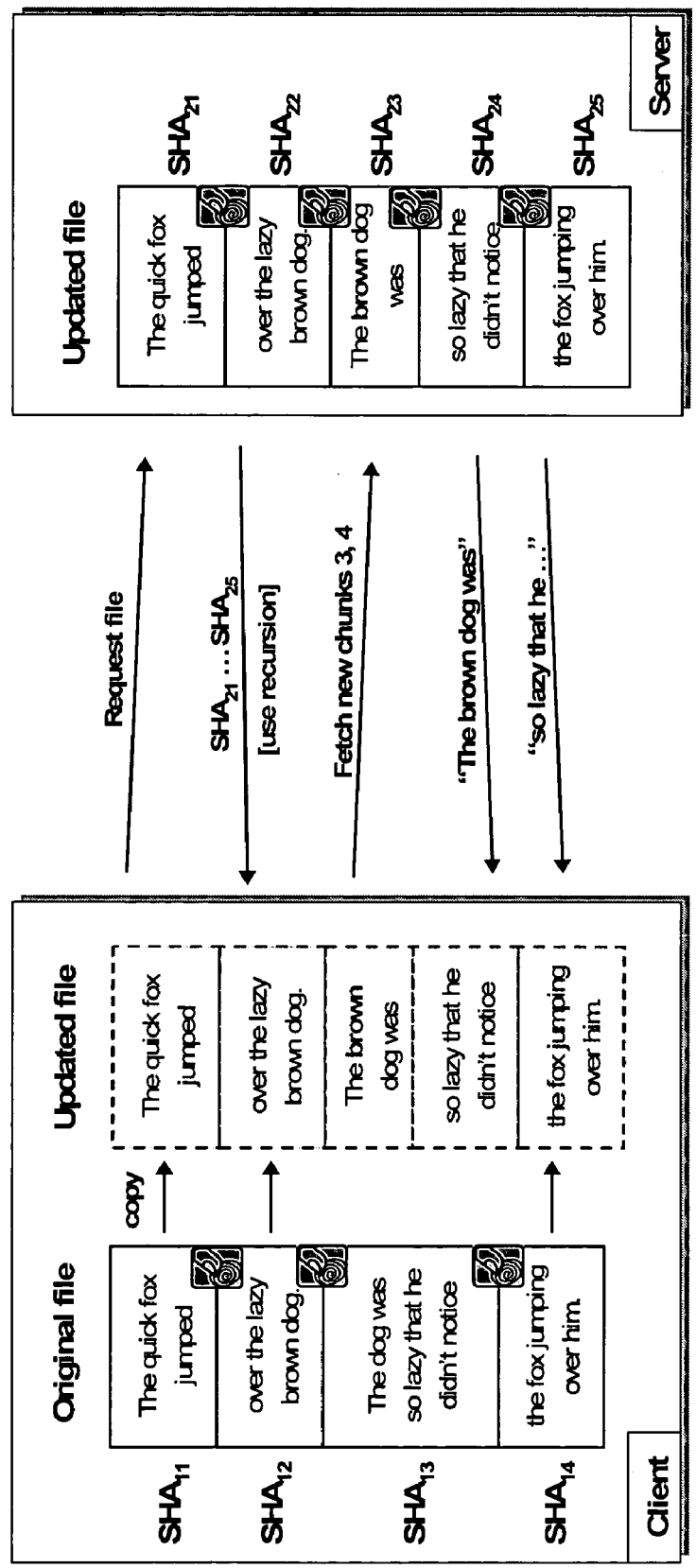
FIG. 7 is a diagram illustrating the interaction of a client and server application using an example RDC procedure.

FIG. 7 is a diagram illustrating the interaction of a client and server application using an example RDC procedure that is arranged according to at least one aspect of the present invention. The original file on both the server and the client contained text "The quick fox jumped over the lazy brown dog. The dog was so lazy that he didn't notice the fox jumping over him."

At a subsequent time, the file on the server is updated to: "The quick fox jumped over the lazy brown dog. The brown dog was so lazy that he didn't notice the fox jumping over him."

As described previously, the client periodically requests the file to be updated. The client and server both chunk the object (the text) into chunks as illustrated. On the client, the chunks are: "The quick fox jumped", "over the lazy brown dog.", "The dog was so lazy that he didn't notice", and "the fox jumping over him."; the client signature list is generated as: $SHA_{11}$, $SHA_{12}$, $SHA_{11}$, and $SHA_{14}$. On the server, the chunks are: "The quick fox jumped", "over the lazy brown dog.", "The brown dog was", "so lazy that he didn't notice", and "the fox jumping over him."; the server signature list is generated as: $SHA_{21}$, $SHA_{22}$, $SHA_{23}$, $SHA_{24}$, and $SHA_{25}$.

The server transmits the signature list ($SHA_{21}$-$SHA_{25}$) using a recursive signature compression technique as previously described. The client recognizes that the locally stored signature list ($SHA_{11}$-$SHA_{14}$) does not match the received signature list ($SHA_{21}$-$SHA_{25}$), and requests the missing chunks 3 and 4 from the server. The server compresses and transmits chunks 3 and 4 ("The brown dog was", and "so lazy that he didn't notice"). The client receives the compressed chunks, decompresses them, and updates the file as illustrated in FIG. 7.

Chunking Analysis

The effectiveness of the basic RDC procedure described above may be increased by optimizing the chunking procedures that are used to chunk the object data and/or chunk the signature and chunk length lists.

The basic RDC procedure has a network communication overhead cost that is identified by the sum of:

(|Signatures and chunk lengths from
  B|=|$O_B$|*|SigLen|/C,      (S1)

where |$O_B$| is the size in bytes of Object $O_B$, SigLen is the size in bytes of a (signature, chunk length) pair, and C is the expected average chunk size in bytes; and Σchunk_length, where (signature, chunk_length) ∈
  Signatures from B,      (S2)

and signature ∉ Signatures from A

The communication cost thus benefits from a large average chunk size and a large intersection between the remote and local chunks. The choice of how objects are cut into chunks determines the quality of the protocol. The local and remote device must agree, without prior communication, on where to cut an object. The following describes and analyzes various methods for finding cuts.

The following characteristics are assumed to be known for the cutting algorithm:

1. Slack: The number of bytes required for chunks to reconcile between file differences. Consider sequences s1, s2, and s3, and form the two sequences s1s3, s2s3 by concatenation. Generate the chunks for those two sequences Chunks1, and Chunks2. If Chunks1' and Chunks2' are the sums of the chunk lengths from Chunks1 and Chunks2, respectively, until the first common suffix is reached, the slack in bytes is given by the following formula:

slack=Chunks$_1$'-|$S_1$|=Chunks$_2$'-|$S_2$|

2. Average chunk size C:

When Objects $O_A$ and $O_B$ have S segments in common with average size K, the number of chunks that can be obtained locally on the client is given by:

S*⌊(K-slack)/C⌋ and (S2) above rewrites to:

|$O_A$|-S*⌊(K-slack)/C⌋

Thus, a chunking algorithm that minimizes slack will minimize the number of bytes sent over the wire. It is therefore advantageous to use chunking algorithms that minimize the expected slack.

Fingerprinting Functions

All chunking algorithms use a fingerprinting function, or hash, that depends on a small window, that is, a limited sequence of bytes. The execution time of the hash algorithms used for chunking is independent of the hash window size when those algorithms are amenable to finite differencing (strength reduction) optimizations. Thus, for a hash window of size k it is should be easy (require only a constant number of steps) to compute the hash #[$b_1$, ..., $b_{k-1}$, $b_k$] using $b_0$, $b_k$, and #[$b_0$, $b_1$, ..., $b_{k-1}$] only. Various hashing functions can be employed such as hash functions using Rabin polynomials, as well as other hash functions that appear computationally more efficient based on tables of pre-computed random numbers.

In one example, a 32 bit Adler hash based on the rolling checksum can be used as the hashing function for fingerprinting. This procedure provides a reasonably good random hash function by using a fixed table with 256 entries, each a pre-computed 16 bit random number. The table is used to convert fingerprinted bytes into a random 16 bit number. The 32 bit hash is split into two 16 bit numbers sum1 and sum2, which are updated given the procedure:

sum1+=table[$b_k$]-table[$b_0$]

sum2+=sum1-k*table[$b_0$]

In another example, a 64 bit random hash with cyclic shifting may be used as the hashing function for fingerprinting. The period of a cyclic shift is bounded by the size of the hash value. Thus, using a 64 bit hash value sets the period of the hash to 64. The procedure for updating the hash is given as:

hash=hash^((table[$b_0$]<<1)|(table[$b_0$]>>u))^table[$b_k$];

hash=(hash<<1)|(hash>>63);

where l =k%64 and u=64-l

In still another example, other shifting methods may be employed to provide fingerprinting. Straight forward cyclic shifting produces a period of limited length, and is bounded by the size of the hash value. Other permutations have longer periods. For instance, the permutation given by the cycles (1 2 3 0) (5 6 7 8 9 10 11 12 13 14 4) (16 17 18 19 20 21 15) (23 24 25 26 22) (28 29 27) (31 30) has a period of length 4*3*5*7*11=4620. The single application of this example permutation can be computed using a right shift followed by operations that patch up the positions at the beginning of each interval.

Analysis of Previous Art for Chunking at Pre-Determined Patterns

Previous chunking methods are determined by computing a fingerprinting hash with a pre-determined window size k (=48), and identifying cut points based on whether a subset of the hash bits match a pre-determined pattern. With random hash values, this pattern may as well be 0, and the relevant subset may as well be a prefix of the hash. In basic instructions, this translates to a predicate of the form:

CutPoint(hash)=0==(hash & ((1<<c)−1)), where c is the number of bits that are to be matched against.

Since the probability for a match given a random hash function is $2^{-c}$, an average chunk size $C=2^c$ results. However, neither the minimal, nor the maximal chunk size is determined by this procedure. If a minimal chunk length of m is imposed, then the average chunk size is:

$C=m+2^c$

A rough estimate of the expected slack is obtained by considering streams $S_1S_3$ and $S_2S_3$. Cut points in $S_1$ and $S_2$ may appear at arbitrary places. Since the average chunk length is $C=m+2^c$, about $(2^c/C)^2$ of the last cut-points in $S_1$ and $S_2$ will be beyond distance m. They will contribute to slack at around $2^c$. The remaining $1-(2^c/C)^2$ contribute with slack of length about C. The expected slack will then be around $(2^c/C)^3 + (1-(2^c/C)^2)*(C/C) = (2^c/C)^3 + 1 - (2^c/C)^2$, which has global minimum for $m=2^{c-1}$, with a value of about 23/27=0.85. A more precise analysis gives a somewhat lower estimate for the remaining $1-(2^c/C)^2$ fraction, but will also need to compensate for cuts within distance m inside $S_3$, which contributes to a higher estimate.

Thus, the expected slack for the prior art is approximately 0.85*C.

Chunking at Filters (New Art)

Chunking at filters is based on fixing a filter, which is a sequence of patterns of length m, and matching the sequence of fingerprinting hashes against the filter. When the filter does not allow a sequence of hashes to match both a prefix and a suffix of the filter it can be inferred that the minimal distance between any two matches must be at least m. An example filter may be obtained from the CutPoint predicate used in the previous art, by setting the first m−1 patterns to 0!=(hash &((1<<c)−1))

and the last pattern to:

0==(hash &((1<<c)−1)).

The probability for matching this filter is given by $(1-p)^{m-1}$ p where p is $2^{-c}$. One may compute that the expected chunk length is given by the inverse of the probability for matching a filter (it is required that the filter not allow a sequence to match both a prefix and suffix), thus the expected length of the example filter is $(1-p)^{-m+1}p^{-1}$. This length is minimized when setting p:=1/m, and it turns out to be around (e*m). The average slack hovers around 0.8, as can be verified by those skilled in the art. An alternative embodiment of this method uses a pattern that works directly with the raw input and does not use rolling hashes.

Chunking at Local Maxima

Chunking at Local Maxima is based on choosing as cut points positions that are maximal within a bounded horizon. In the following, we shall use h for the value of the horizon. We say that the hash at position offset is an h-local maximum if the hash values at offsets offset−h, ..., offset−1, as well as offset+1, ..., offset+h are all smaller than the hash value at offset. In other words, all positions h steps to the left and h steps to the right have lesser hash values. Those skilled in the art will recognize that local maxima may be replaced by local minima or any other metric based comparison (such as "closest to the median hash value").

Figure 8:
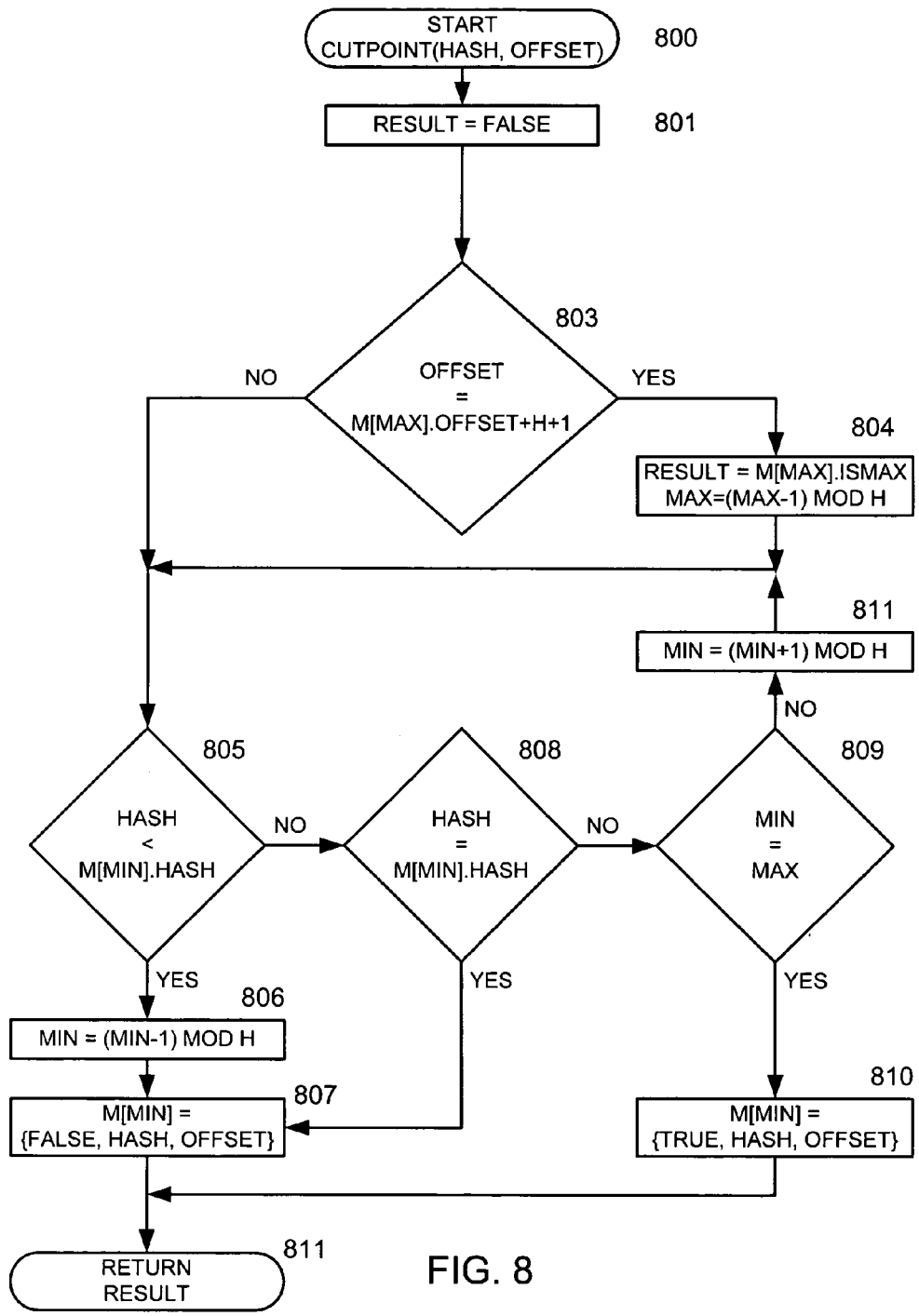
FIG. 8 is a diagram illustrating a process flow for an example chunking procedure.

The set of local maxima for an object of size n may be computed in time bounded by 2·n operations such that the cost of computing the set of local maxima is close to or the same as the cost of computing the cut-points based on independent chunking. Chunks generated using local maxima always have a minimal size corresponding to h, with an average size of approximately 2h+1. A CutPoint procedure is illustrated in FIGS. 8 and 9, and is described as follows below:

1. Allocate an array M of length h whose entries are initialized with the record {isMax=false, hash=0, offset=0}. The first entry in each field (isMax) indicates whether a candidate can be a local maximum. The second field entry (hash) indicates the hash value associated with that entry, and is initialized to 0 (or alternatively, to a maximal possible hash value). The last field (offset) in the entry indicates the absolute offset in bytes to the candidate into the fingerprinted object.

2. Initialize offsets min and max into the array M to 0. These variables point to the first and last elements of the array that are currently being used.

3. CutPoint(hash, offset) starts at step 800 in FIG. 8 and is invoked at each offset of the object to update M and return a result indicating whether a particular offset is a cutpoint.

The procedure starts by setting result=false at step 801. At step 803, the procedure checks whether M[max].offset+h+1=offset. If this condition is true, execution continues at step 804 where the following assignments are performed: result is set to M[max].isMax, and max is set to max−1% h. Execution then continues at step 805. If the condition at step 803 is false, execution continues at step 805.

At step 805, the procedure checks whether M[min].hash>hash. If the condition is true, execution continues at step 806, where min is set to (min−1) % h. Execution the continues at step 807 where M[min] is set to {isMax=false, hash=hash, offset=offset}, and to step 811, where the computed result is returned.

If the condition at step 805 is false, execution continues to step 808, where the procedure checks for whether M[min].hash=hash. If this condition is true, execution continues at step 807.

If the condition at step 808 is false, execution continues at step 809, where the procedure checks whether min =max. If this condition is true, execution continues at step 810, where M[min] is set to {isMax=true, hash=hash, offset=offset}. Execution then continues at step 811, where the computed result is returned.

If the condition at step 809 is false, execution continues at step 811, where min is set to (min+1) % h. Execution then continues back at step 805.

4. When CutPoint(hash, offset) returns true, it will be the case that the offset at position offset−n−1 is a new cutpoint.

Analysis of Local Maximum Procedure

An object with n bytes is processed by calling CutPoint n times such that at most n entries are inserted for a given object. One entry is removed each time the loop starting at step 805 is repeated such that there are no more than n entries to delete.

Thus, the processing loop may be entered once for every entry and the combined number of repetitions may be at most n. This implies that the average number of steps within the loop at each call to CutPoint is slightly less than 2, and the number of steps to compute cut points is independent of h.

Since the hash values from the elements form a descending chain between min and max, we will see that the average distance between min and max (|min−max| % h) is given by the natural logarithm of h. Offsets not included between two adjacent entries in M have hash values that are less than or equal to the two entries. The average length of such chains is given by the recurrence equation $f(n)=1+1/n * \Sigma_{k<n} f(k)$. The average length of the longest descending chain on an interval of length n is 1 greater than the average length of the longest descending chain starting from the position of the largest element, where the largest element may be found at arbitrary positions with a probability of 1/n. The recurrence relation has as solution corresponding to the harmonic number $H_n=1+½+⅓+¼+ \ldots +1/n$, which can be validated by substituting Hn into the equation and performing induction on n. Hn is proportional to the natural logarithm of n. Thus, although array M is allocated with size h, only a small fraction of size ln(h) is ever used at any one time.

Computing min and max with modulus h permits arbitrary growth of the used intervals of M as long as the distance between the numbers remain within h.

The choice of initial values for M implies that cut-points may be generated within the first h offsets. The algorithm can be adapted to avoid cut-points at these first h offsets.

The expected size of the chunks generated by this procedure is around 2h+1. We obtain this number from the probability that a given position is a cut-point. Suppose the hash has m different possible values. Then the probability is determined by:

$$\Sigma_{0 \leq k<m} 1/m(k/m)^{2h}.$$

Approximating using integration $\int_{0 \leq x<m} 1/m\ (x/m)^{2h} dx=1/(2h+1)$ indicates the probability when m is sufficiently large.

The probability can be computed more precisely by first simplifying the sum to:

$$(1/m)^{2h+1}\Sigma_{0 \leq k<m}k^{2h},$$

which using Bernoulli numbers $B_k$ expands to:

$$(1/m)^{2h+1}1/(2h+1)\Sigma_{0 \leq k<2h}(2h+1)!/k!(2h+1-k)!B_k m^{2h+1-k}$$

The only odd Bernoulli number that is non-zero is $B_1$, which has a corresponding value of −½. The even Bernoulli numbers satisfy the equation:

$$H_\infty^{(2n)}=(-1)^{n-1}2^{2n-1}\pi^{2n}B_{2n}/(2n)!$$

The left hand side represents the infinite sum $1+(½)2n+(⅓)2n+\ldots$, which for even moderate values of n is very close to 1.

When m is much larger than h, all of the terms, except for the first can be ignored, as we saw by integration. They are given by a constant between 0 and 1 multiplied by a term proportional to $h^{k-1}/m^k$. The first term (where $B_0=1$) simplifies to 1/(2h+1). (the second term is −1/(2m), the third is $h/(6m^2)$).

For a rough estimate of the expected slack consider streams $S_1S_3$ and $S_2S_3$. The last cut-points inside $s_1$ and $S_2$ may appear at arbitrary places. Since the average chunk length is about 2h+1 about ¼'th of the last cut-points will be within distance h in both $S_1$ and $S_2$. They will contribute to cut-points at around ⅞ h. In another ½ of the cases, one cut-point will be within distance h the other beyond distance h. These contribute with cut-points around ¾h. The remaining ¼'th of the last cut-points in $S_1$ and $S_2$ will be in distance larger than h. The expected slack will therefore be around ¼*⅞+½*¾+¼*¼=0.66.

Thus, the expected slack for our independent chunking approach is 0.66*C, which is an improvement over the prior art (0.85*C).

There is an alternate way of identifying cut-points that require executing in average fewer instructions while using space at most proportional to h, or in average ln h. The procedure above inserts entries for every position 0 . . . n−1 in a stream of length n. The basic idea in the alternate procedure is to only update when encountering elements of an ascending chain within intervals of length h. We observed that there will in average only be ln h such updates per interval. Furthermore, by comparing the local maxima in two consecutive intervals of length h one can determine whether each of the two local maxima may also be an h local maximum. There is one peculiarity with the alternate procedure; it requires computing the ascending chains by traversing the stream in blocks of size h, each block gets traversed in reverse direction.

In the alternate procedure (see FIGS. 10 and 11), we assume for simplicity that a stream of hashes is given as a sequence. The subroutine CutPoint gets called for each subsequence of length h (expanded to "horizon" in the Figures). It returns zero or one offsets which are determined to be cut-points. Only ln(h) of the calls to Insert will pass the first test.

Insertion into A is achieved by testing the hash value at the offset against the largest entry in A so far.

The loop that updates both A[k] and B[k].isMax can be optimized such that in average only one test is performed in the loop body. The case B[l].hash<=A[k].hash and B[l].isMax is handled in two loops, the first checks the hash value against B[l].hash until it is not less, the second updates A[k]. The other case can be handled using a loop that only updates A[k] followed by an update to B[l].isMax.

Each call to CutPoint requires in average ln h memory writes to A, and with loop hoisting h+ln h comparisons related to finding maxima. The last update to A[k].isMax may be performed by binary search or by traversing B starting from index 0 in at average at most log ln h steps. Each call to CutPoint also requires re-computing the rolling hash at the last position in the window being updated. This takes as many steps as the size of the rolling hash window.

Observed Benefits of the Improved Chunking Algorithms

The minimal chunk size is built into both the local maxima and the filter methods described above. The conventional implementations require that the minimal chunk size is supplied separately with an extra parameter.

The local max (or mathematical) based methods produce measurable better slack estimate, which translates to further compression over the network. The filter method also produces better slack performance than the conventional methods.

Both of the new methods have a locality property of cut points. All cut points inside s3 that are beyond horizon will be cut points for both streams s1s3 and s2s3. (in other words, consider stream s1s3, if p is a position $\geq$|s1|+horizon and p is a cut point in s1s3, then it is also a cut point in s2s3. The same property holds the other direction (symmetrically), if p is a cut point in s2s3, then it is also a cut point in s1s3). This is not the case for the conventional methods, where the requirement that cuts be beyond some minimal chunk size may interfere adversely.

Alternative Mathematical Functions

Although the above-described chunking procedures describe a means for locating cut-points using a local maxima calculation, the present invention is not so limited. Any mathematical function can be arranged to examine potential cutpoints. Each potential cut-point is evaluated by evaluating hash values that are located within the horizon window about a considered cut-point. The evaluation of the hash values is accomplished by the mathematical function, which may include at least one of locating a maximum value within the horizon, locating a minimum values within the horizon, evaluating a difference between hash values, evaluating a difference of hash values and comparing the result against an arbitrary constant, as well as some other mathematical or statistical function.

The particular mathematical function described previously for local maxima is a binary predicate "_>_". For the case where p is an offset in the object, p is chosen as a cut-point if $hash_p > hash_k$, for all k, where p-horizon$\leq$k<p, or p<k$\leq$p+horizon. However, the binary predicate> can be replaced with any other mathematical function without deviating from the spirit of the invention.

Finding Candidate Objects for Remote Differential Compression

The effectiveness of the basic RDC procedure described above may be increased by finding candidate objects on the receiver, for signature and chunk reuse during steps 4 and 8 of the RDC algorithm, respectively. The algorithm helps Device A identify a small subset of objects denoted by: $O_{A1}$, $O_{A2}, \ldots, O_{An}$ that are similar to the object $O_B$ that needs to be transferred from Device B using the RDC algorithm. $O_{A1}$, $O_{A2}, \ldots, O_{An}$ are part of the objects that are already stored on Device A.

The similarity between two objects $O_B$ and $O_A$ is measured in terms of the number of distinct chunks that the two objects share divided by the total number of distinct chunks in the first object. Thus if Chunks($O_B$) and Chunks($O_A$) are the sets of chunks computed for $O_B$ and $O_A$ of the RDC algorithm, respectively, then, using the notation |X| to denote the cardinality, or number of elements, of set X:

$$\text{Similarity}(O_B, O_A) = \frac{\left|\left\{\begin{array}{c} c_B \mid c_B \in \text{Chunks}(O_B) \land \\ \exists c_A \in \text{Chunks}(O_A) \cdot c_B = c_A \end{array}\right\}\right|}{\left|\begin{array}{c} \{c_B \mid c_B \in \text{Chunks}(O_B)\} \cup \\ \{c_A \mid c_A \in \text{Chuncks}(O_A)\} \end{array}\right|}$$

As a proxy for chunk equality, the equality on the signatures of the chunks is used. This is highly accurate if the signatures are computed using a cryptographically secure hash function (such as SHA-1 or MD5), given that the probability of a hash collision is extremely low. Thus, if Signatures ($O_B$) and Signatures($O_A$) are the sets of chunk signatures computed for $O_B$ and $O_A$ in the chunking portion of the RDC algorithm, then:

$$\text{Similarity}(O_B, O_A) \cong \frac{\left|\left\{\begin{array}{c} Sig_B \mid Sig_B \in \text{Signatures}(O_B) \land \\ \exists Sig_A \in \text{Signatures}(O_A) \cdot Sig_B = Sig_A \end{array}\right\}\right|}{\left|\begin{array}{c} \{Sig_B \mid Sig_B \in \text{Signatures}(O_B)\} \cup \\ \{Sig_A \mid Sig_A \in \text{Signatures}(O_A)\} \end{array}\right|}$$

Given an object $O_B$ and the set of objects Objects$_A$ that are stored on Device A, the members of Objects$_A$ that have a degree of similarity with $O_B$ which exceeds a given threshold s are identified. A typical value for s may be s=0.5, (50% similairity) i.e. we are interested in objects that have at least half of their chunks in common with $O_B$. The value for s, however, may be set at any value that makes sense for the application. For example, s could be set between 0.01 and 1.0 (1% similar to 100% similar). This set of objects is defined as:

Similar($O_B$, Objects$_A$, s)={$O_A$|$O_A \in$Objects$_A \hat{}$Similarity($O_B$, $O_A$)$\geq$S}

The set of objects $O_{A1}$, $O_{A2}, \ldots, O_{An}$ is computed as a subset of Similar($O_B$, Objects$_A$, s) by taking the best n matches.

The basic RDC algorithm described above is modified as follows to identify and use the set of similar objects $O_{A1}$, $O_{A2}, \ldots, O_{An}$.

Figure 12:
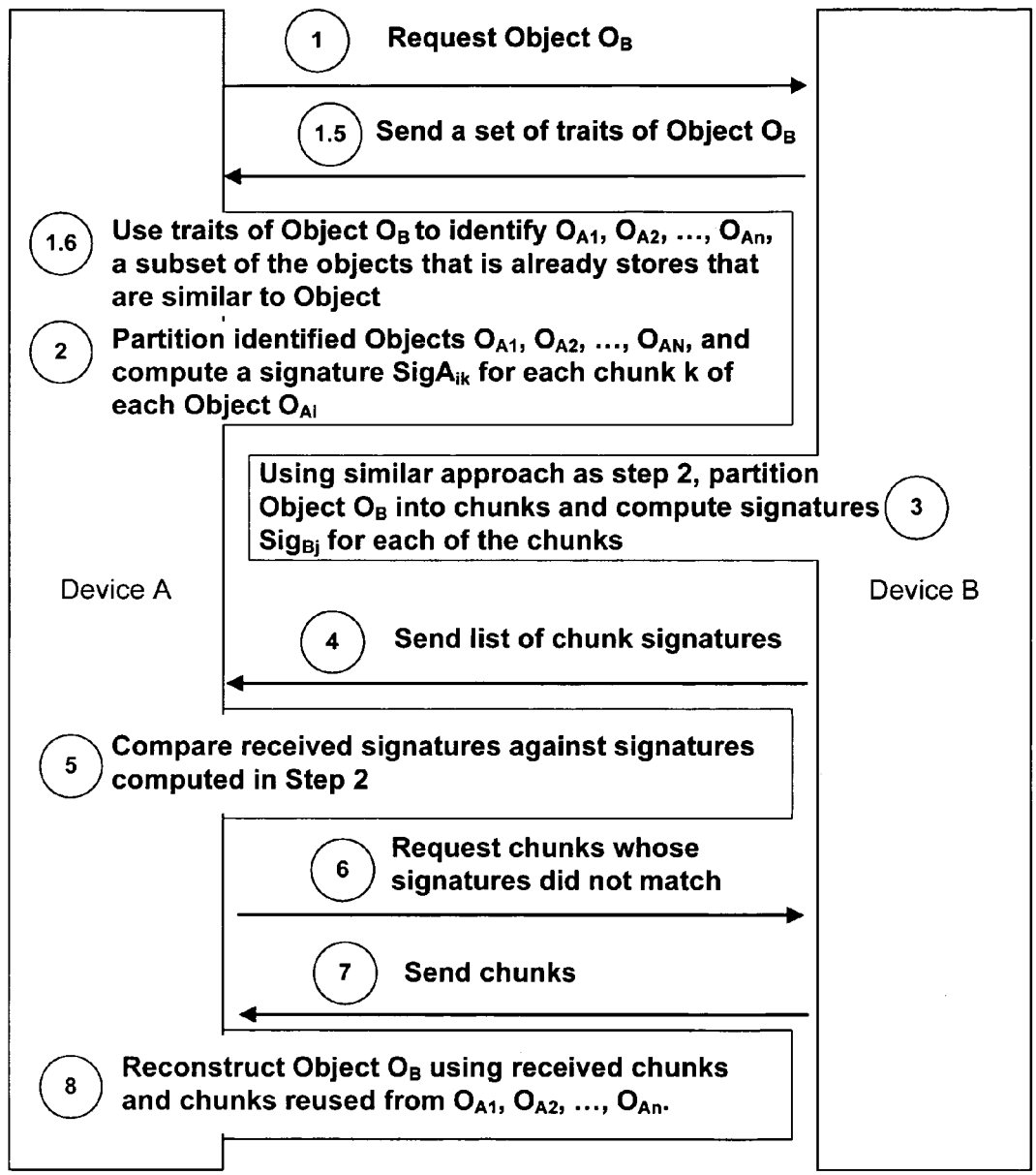
FIG. 12 illustrates an RDC algorithm modified to find and use candidate objects.

FIG. 12 illustrates an RDC algorithm modified to find and use candidate objects, in accordance with aspects of the invention. The protocol for finding and using candidate objects on Device A and the transferring the updated object $O_B$ from device B to device A is described. A similar protocol may be used to transfer an object from device A to device B, and the transfer can be initiated at the behest of either device A or device B without significantly changing the protocol described below.

1. Device A sends device B a request to transfer Object $O_B$ using the RDC protocol.
1.5 Device B sends Device A a set of traits of Object $O_B$, Traits($O_B$). Generally, the traits are a compact representation of the characteristics relating to object $O_B$. As will be described later, Device B may cache the traits for $O_B$ so that it does not need to recompute them prior to sending them to Device A.
1.6. Device A uses Traits($O_B$) to identify $O_{A1}$, $O_{A2}, \ldots, O_{An}$, a subset of the objects that it already stores, that are similar to Object $O_B$. This determination is made in a probabilistic manner.
2. Device A partitions the identified Objects $O_{A1}$, $O_{A2}, \ldots, O_{An}$ into chunks. The partitioning occurs in a data-dependent fashion, by using a fingerprinting function that is computed at every byte position of the objects. A chunk boundary is determined at positions for which the fingerprinting function satisfies a given condition. Following the partitioning into chunks, Device A computes a signature Sig$_{Aik}$ for each chunk k of each Object $O_{Ai}$.
3. Using a similar approach as in step 2, Device B partitions Object $O_B$ into chunks, and computes the signatures Sig$_{Bj}$ for each of the chunks. The partitioning algorithm used in step 3 must match the one in step 2 above.
4. Device B sends list of chunk signatures (Sig$_{B1}$ ... Sig$_{Bn}$) to Device A. This list provides the basis for Device A being able to reconstruct Object $O_B$. In addition to the chunk signatures Sig$_{Bi}$, information will be sent about the offset and length of each chunk in Object $O_B$.
5. As Device A receives the chunk signatures from Device B, it compares the received signatures against the set of signatures (Sig$_{A11}$, ... Sig$_{A1m}$, ..., Sig$_{An1}$, ... Sig$_{An1}$) that it has computed in step 2. As part of this comparison, Device A records every distinct signature value it received from Device B that does not match one of its own signatures Sig$_{Aik}$ computed on the chunks of Objects $O_{A1}, O_{A2}, \ldots, O_{An}$.
6. Device A sends a request to Device B for all the chunks whose signatures were received in the previous step from Device B, but which did not have a matching signature on Device A. The chunks are requested by offset and length in Object $O_B$, based on corresponding information that was sent in Step 4.
7. Device B sends the content associated with all the requested chunks to device A.

8. Device A reconstructs Object $O_B$ by using the chunks received in step 6 from Device B, as well as its own chunks of objects $O_{A1}, O_{A2}, \ldots, O_{An}$ that matched signatures sent by Device B in step 4. After this reconstruction step is complete, Device A may now add the reconstructed copy of Object $O_B$ to its already stored objects.

To minimize network traffic and CPU overhead, Traits($O_B$) should be very small and the determination of the set of similar objects $O_{A1}, O_{A2}, \ldots, O_{An}$ be performed with very few operations on Device A.

Computing the Set of Traits for an Object

The set of traits for a object O, Traits(O), is computed based on the chunk signatures computed for O, as described for steps 2 or 3 of the RDC algorithm, respectively.

Figure 13:
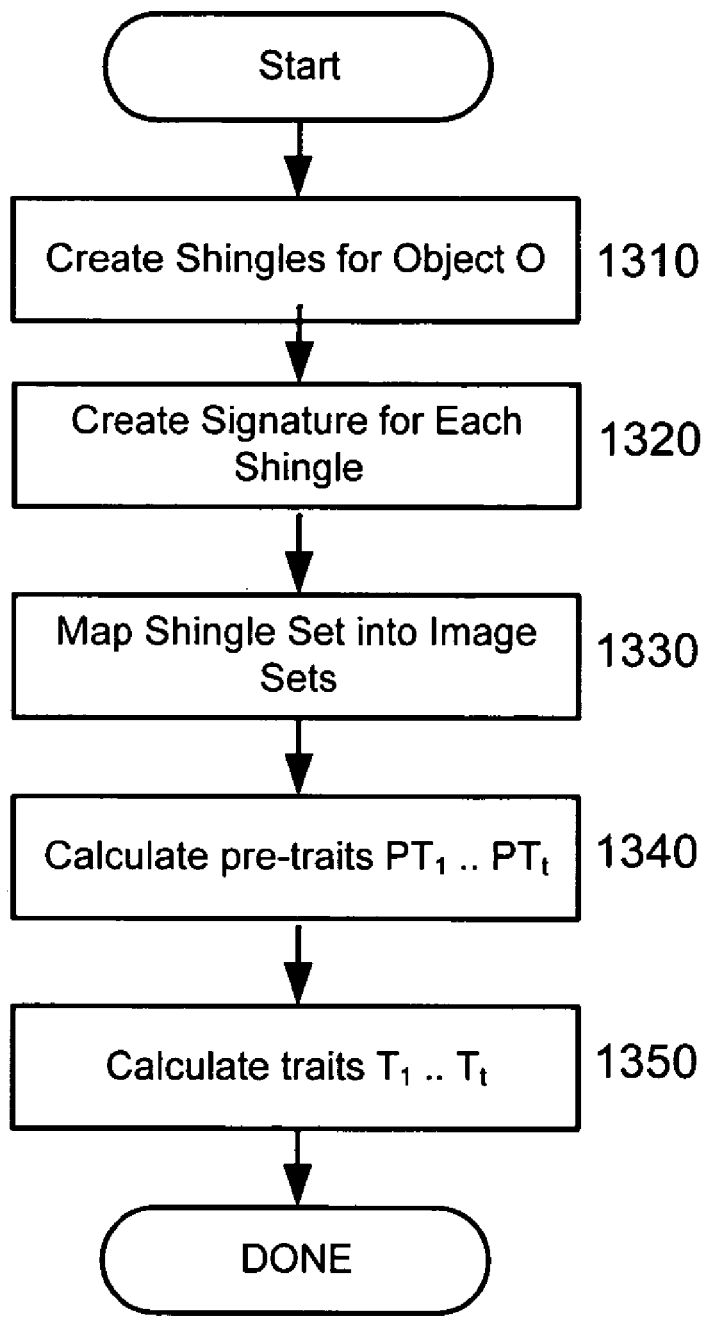
FIG. 13 and 14 show a process and an example of a trait computation.
Figure 14:
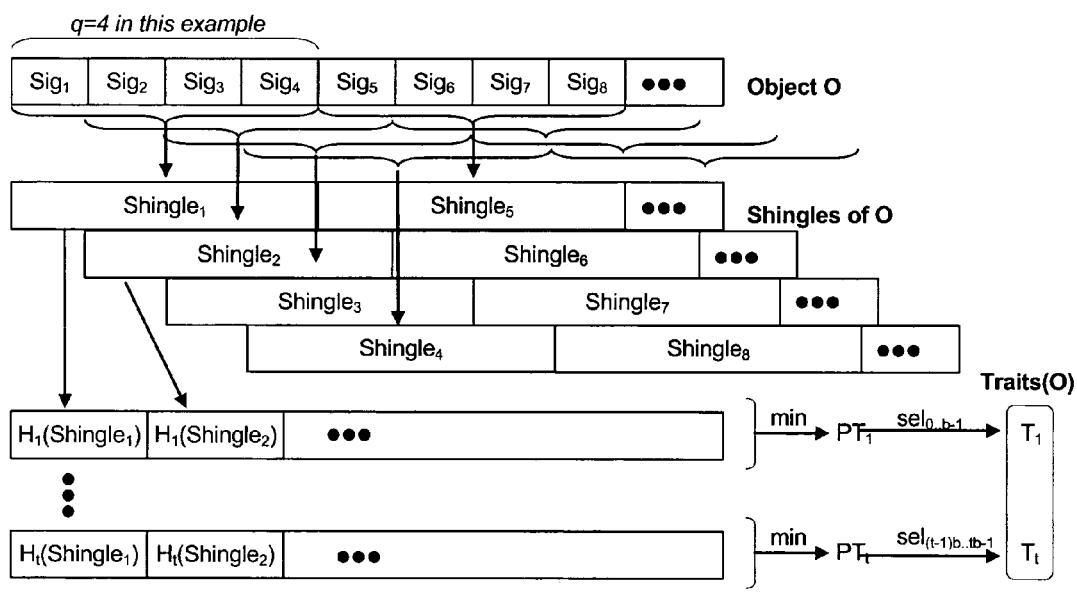

FIGS. 13 and 14 show a process and an example of a trait computation, in accordance with aspects of the invention.

The algorithm for identifying similar objects has four main parameters (q, b, t, x) that are summarized below.
- q: Shingle size
- b: Number of bits per trait
- t: Number of traits per object
- x: Minimum number of matching traits The following steps are used to compute the traits for object O, Traits(O).

1. At block 1310, the chunk signatures of $0, Sig_1 \ldots Sig_n$ are grouped together into overlapping shingles of size q, where every shingle comprises q chunk signatures, with the exception of the last q−1 shingles, which will contain fewer than q signatures. Other groupings (discontiguous subsets, disjoint subsets, etc.) are possible, but it is practically useful that inserting an extra signature causes all of the previously considered subsets to still be considered.

2. At block 1320, for each shingle $1 \ldots n$, a shingle signature $Shingle_1 \ldots Shingle_n$ is computed by concatenating the q chunk signatures forming the shingle. For the case where q=1, $Shingle_1 = Sig_1, \ldots, Shingle_n = Sig_n$.

3. At block 1330, the shingle set $\{Shingle_1 \ldots Shingle_n\}$ is mapped into t image sets through the application of t hash functions $H_1 \ldots H_t$. This generates t image sets, each containing n elements:

$$IS_1 = \{H_1(Shingle_1), H_1(Shingle_2), \ldots, H_1(Shingle_n)\}$$

...

$$IS_t = \{H_{t(Shingle1)}, H_t(Shingle_2), \ldots, H_t(Shingle_n)\}$$

4. At block 1340, the pre-traits $PT_1 \ldots PT_t$ are computed by taking the minimum element of each image set:

$$PT_1 = \min(IS_1)$$

...

$$PT_t = \min(IS_t).$$

Other deterministic mathematical functions may also be used to compute the pre-traits. For example, the pre-traits $PT_1 \ldots PT_t$ are computed by taking the maximum element of each image set:

$$PT_1 = \max(IS_1)$$

...

$$PT_t = \max(IS_t).$$

Mathematically, any mapping carrying values into a well-ordered set will suffice, max and min on bounded integers being two simple realizations.

5. At block 1350, the traits $T_1 \ldots T_t$ are computed by selecting b bits out of each pre-trait $PT_1 \ldots PT_t$. To preserve independence of the samples, it is better to choose non-overlapping slices of bits, $0 \ldots b-1$ for the first, $b \ldots 2b-1$ for the second, etc, if the pre-traits are sufficiently long:

$$T_1 = \text{select}_{0 \ldots b-1}(PT_1)$$

...

$$T_t = \text{select}_{(t-1)b \ldots tb-1}(PT_t)$$

Any deterministic function may be used to create traits that are smaller in size than the pre-traits. For instance, a hash function could be applied to each of the pre-traits so long as the size of the result is smaller than the pre-trait; if the total number of bits needed (tb) exceeds the size of a pre-trait, some hash functions should be used to expand the number of bits before selecting subsets.

The number of traits t and the trait size b are chosen so that only a small total number of bits (t*b) is needed to represent the traits for an object. This is advantageous if the traits are precomputed and cached by Device A, as will be described below. According to one embodiment, some typical combinations of (b,t) parameters that have been found to work well are e.g. (4,24) and (6,16), for a total of 96 bits per object. Any other combinations may also be used. For purposes of explanation, the $i^{th}$ trait of object A will be denoted by $T_i(A)$.

Efficiently Selecting the Pre-Traits

To efficiently select the pre-traits $PT_1 \ldots PT_t$, the following approach is used, allowing partial evaluation of the shingles, and thus reducing the computational requirements for selecting the pre-traits. Logically, each $H_i$ is divided into two parts, $High_i$ and $Low_i$. Since only the minimum element of each image set is selected, the $High_i$ is computed for every chunk signature and the $Low_i$ is computed only for those chunk signatures which achieve the minimum value ever achieved for $High_i$. If the High values are drawn from a smaller space, this may save computation. If, further, several High values are bundled together, significant computation may be saved. Suppose, for instance, that each High value is 8 bits long. Eight of these can be packed into a long integer; at the cost of computing a single 8-byte hash from a signature, that value can be chopped into eight independent one byte-slices. If only the High value were needed, this would reduce computational costs by a factor of eight. However, on average one time in 256 a corresponding Low value needs to be computed and compared to other Low values corresponding to equal High values.

Finding Similar Objects Using the Sets of Traits

The algorithm approximates the set of objects similar to a given object $O_B$ by computing the set of objects having similar traits to $O_B$:

$$\text{TraitSimilarity}(O_B, O_A) = |\{i | T_i(A) = T_i(B)\}|$$

$$\text{SimilarTraits}(O_B, \text{Objects}_A, X)$$
$$= \{O_A | O_A \in \text{Objects}_{A, \text{TraitSimilarity}}(O_B, O_A) \geq t\}$$

Other computations from which these values might be derived would work just as well.

To select the n most similar objects to a given object $O_B$, SimilarTraits($O_B$, Objects$_A$, x) is computed and the n best matching objects out of that set are taken. If the size of SimilarTraits($O_B$, Objects$_A$, x) is smaller than n, the entire set is taken. The resulting set of objects forms a potential set of objects $O_{A1}, O_{A2}, \ldots, O_{An}$ identified in step 1.6 of the modified RDC algorithm illustrated in FIG. 12. According to the embodiments, objects may be chosen guided by similarity, but trying also to increase diversity in the set of objects by choosing objects similar to the target, but dissimilar from one another, or by making other choices from the set of objects with similar traits.

According to one embodiment, the following combinations of parameters (q,b,t,x) may be used: (q=1,b=4,t=24, x=9) and (q=1,b=6,t=16,x=5).

Figure 15:
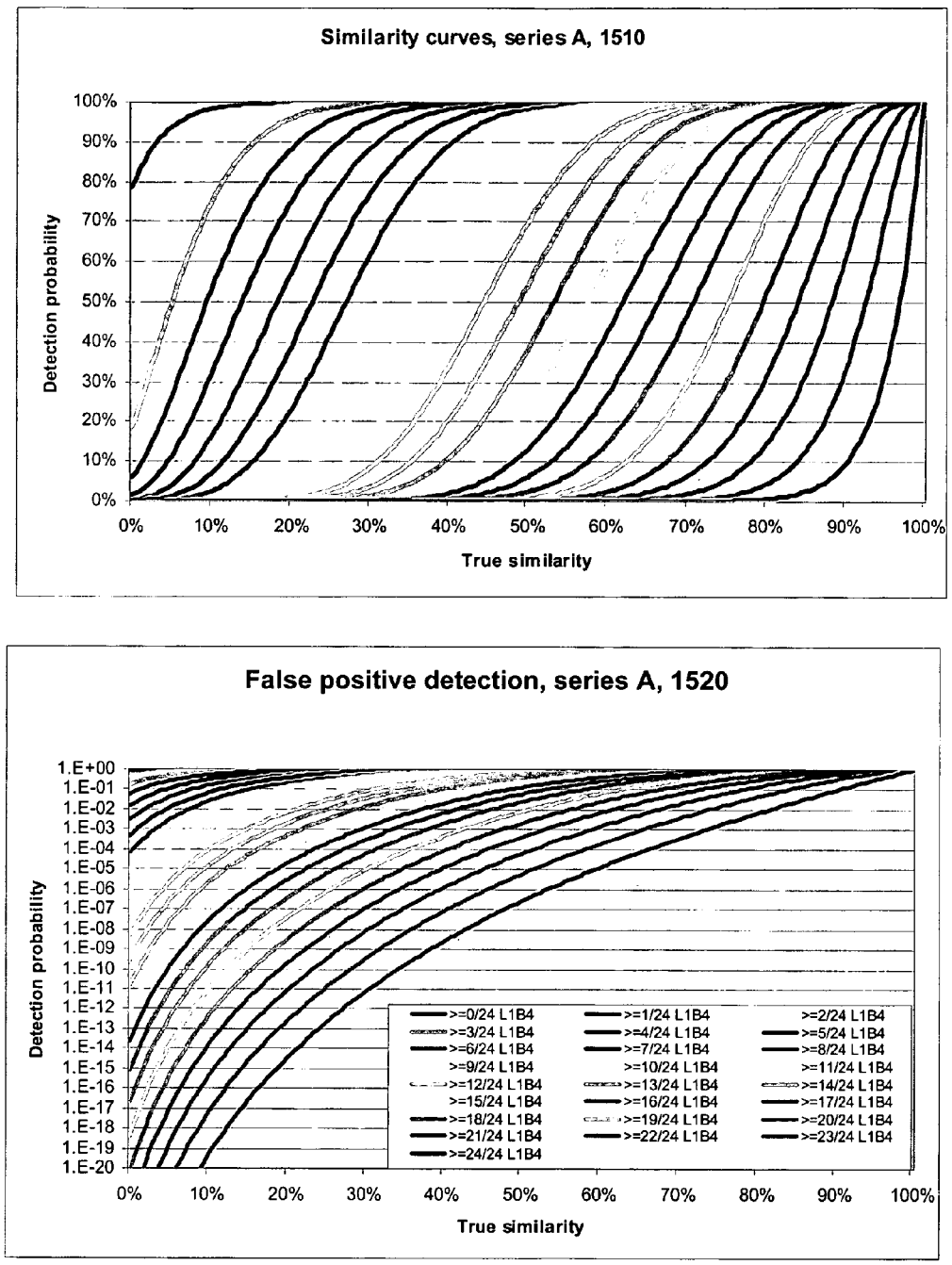
FIGS. 15 and 16 may be used when selecting the parameters for b and t.
Figure 16:
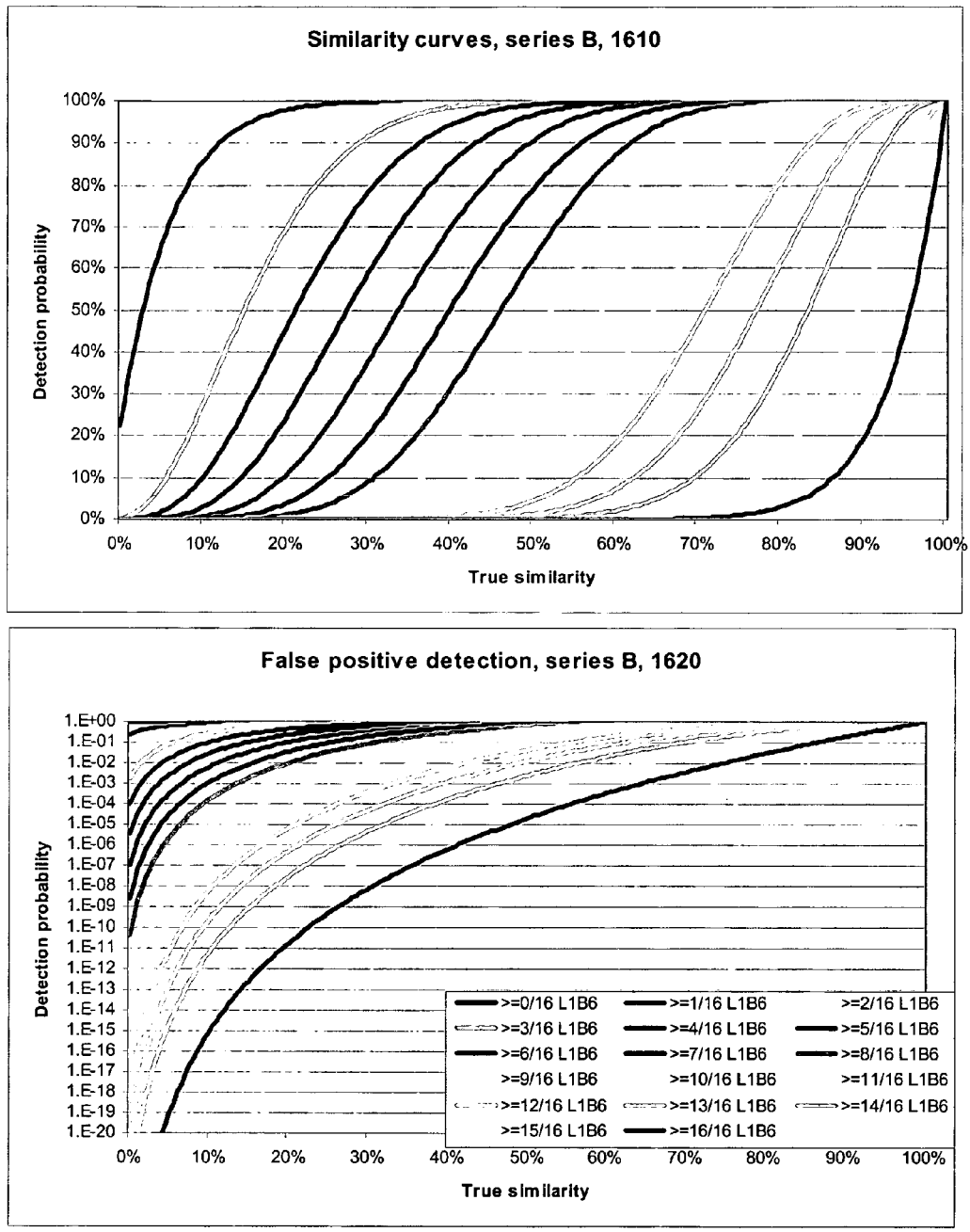

FIGS. 15 and 16 may be used when selecting the parameters for b and t, in accordance with aspects of the present invention. The curves for the probability of detecting matches and for false positives first for (b=4, t=24) is shown in FIG. 15, and then for (b=6, t=16) is shown in FIG. 16. Both sets of similarity curves (1510 and 1610) allow the probabilistic detection similar objects with true similarity in the range of 0-100%. According to one embodiment, the false positive rate illustrated in displays 1520 and 1620 drops to an acceptable level at roughly 10 of 24 (providing 40 bits of true match), and at 6 of 16 (36 bits of match); the difference in the required number of bits is primarily due to the reduced number of combinations drawing from a smaller set. The advantage of the larger set is increased recall: fewer useful matches will escape attention; the cost is the increased rate of falsely detected matches. To improve both precision and recall, the total number of bits may be increased. Switching to (b=5, t=24), for instance would dramatically improve precision, at the cost of increasing memory consumption for object traits.

A Compact Representation for the Sets of Traits

It is advantageous for both Device A and Device B to cache the sets of traits for all of their stored objects so that they don't have to recompute their traits every time they execute steps 1.6 and 1.5, respectively, of the modified RDC algorithm (See FIG. 12 and related discussion). To speed up the RDC computation, the trait information may be stored in Device A's and Device B's memory, respectively.

The representation described below uses on the order of t+p memory bytes per object, where t is the number of traits and p is the number of bytes required to store a reference or a pointer to the object. Examples of references are file paths, file identifiers, or object identifiers. For typical values of t and p, this approach can support one million objects using less than 50 MB of main memory. If a device stores more objects, it may use a heuristic to prune the number of objects that are involved in the similarity computation. For instance, very small objects may be eliminated a priori because they cannot contribute too many chunks in steps 4 and 8 of the RDC algorithm illustrated in FIG. 12.

Figure 17:
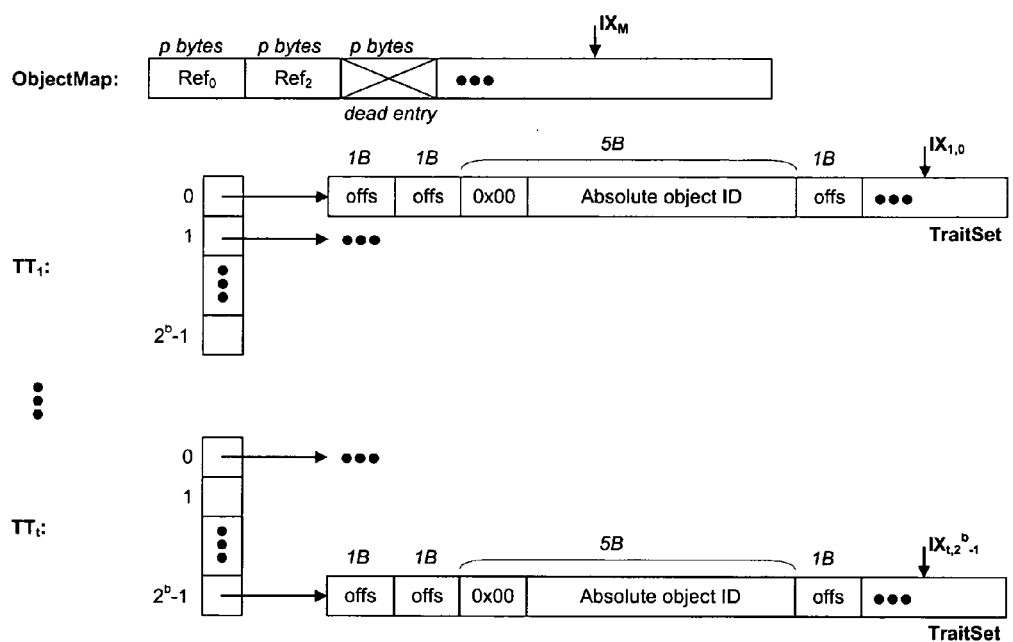
FIG. 17 illustrates data structures that make up a compact representation of: an Object Map and a set of Trait Tables.

FIG. 17 illustrates data structures that make up a compact representation of: an ObjectMap and a set of t Trait Tables, in accordance with aspects of the invention.

Initially, short identifiers, or object IDs, are assigned to all of the objects. According to one embodiment, these identifiers are consecutive non-negative 4-byte integers, thus allowing the representation of up to 4 Billion objects.

A data structure (ObjectMap) maintains the mapping from object IDs to object references. It does not matter in which order objects stored on a device get assigned object IDs. Initially, this assignment can be done by simply scanning through the device's list of stored objects. If an object gets deleted, its corresponding entry in ObjectMap is marked as a dead entry (by using a reserved value for the object reference). If an object is modified, it corresponding entry in ObjectMap is marked as a dead entry, and the object gets assigned the next higher unused object ID.

When the ObjectMap becomes too sparse (something that can be easily determined by keeping track of the total size and the number of dead entries), both the ObjectMap and the Trait Tables are discarded and rebuilt from scratch.

The Trait Tables form a two-level index that maps from a trait number (1 to t) and a trait value (0 to $2^b-1$) to a TraitSet, the set of object IDs for the objects having that particular trait. A TraitSet is represented as an array with some unused entries at the end for storing new objects. An index $IX_{i,k}$ keeps track of the first unused entry in each TraitSet array to allow for appends.

Within a TraitSet, a particular set of objects is stored in ascending order of object IDs. Because the space of object IDs is kept dense, consecutive entries in the TraitSets can be expected to be "close" to each other in the object ID space—on average, two consecutive entries should differ by about $t*2^b$ (but by at least 1). If the values of t and b are chosen so that $t*2^b \ll 255$, then consecutive entries can be encoded using on average only one unsigned byte representing the difference between the two object ID, as shown in FIG. 17. An escape mechanism is provided by using the 0x00 byte to indicate that a full 4-byte object ID follows next, for the rare cases where the two consecutive object IDs differ by more than 255.

According to a different embodiment, if an object ID difference is smaller than 256 then it can be represented as a single byte, otherwise the value zero is reserved to indicate that subsequent bytes represent the delta minus 256, say, by using a 7 in 8 representation. Then, for b=6, 98% of deltas will fit in one byte, 99.7% fit in two bytes, and all but twice in a billion into three bytes. It has been found that this scheme uses on average 1.02 bytes per object, compared to 1.08 bytes per object for the scheme shown in FIG. 17.

Entries in the Trait Tables corresponding to dead object IDs can be left in the Trait Tables. New entries are appended at the end (using indices $IX_{1,0} \ldots IX_{t,2^b-1}$).

Finding Similar Objects using the Compact Representation

Figure 18:
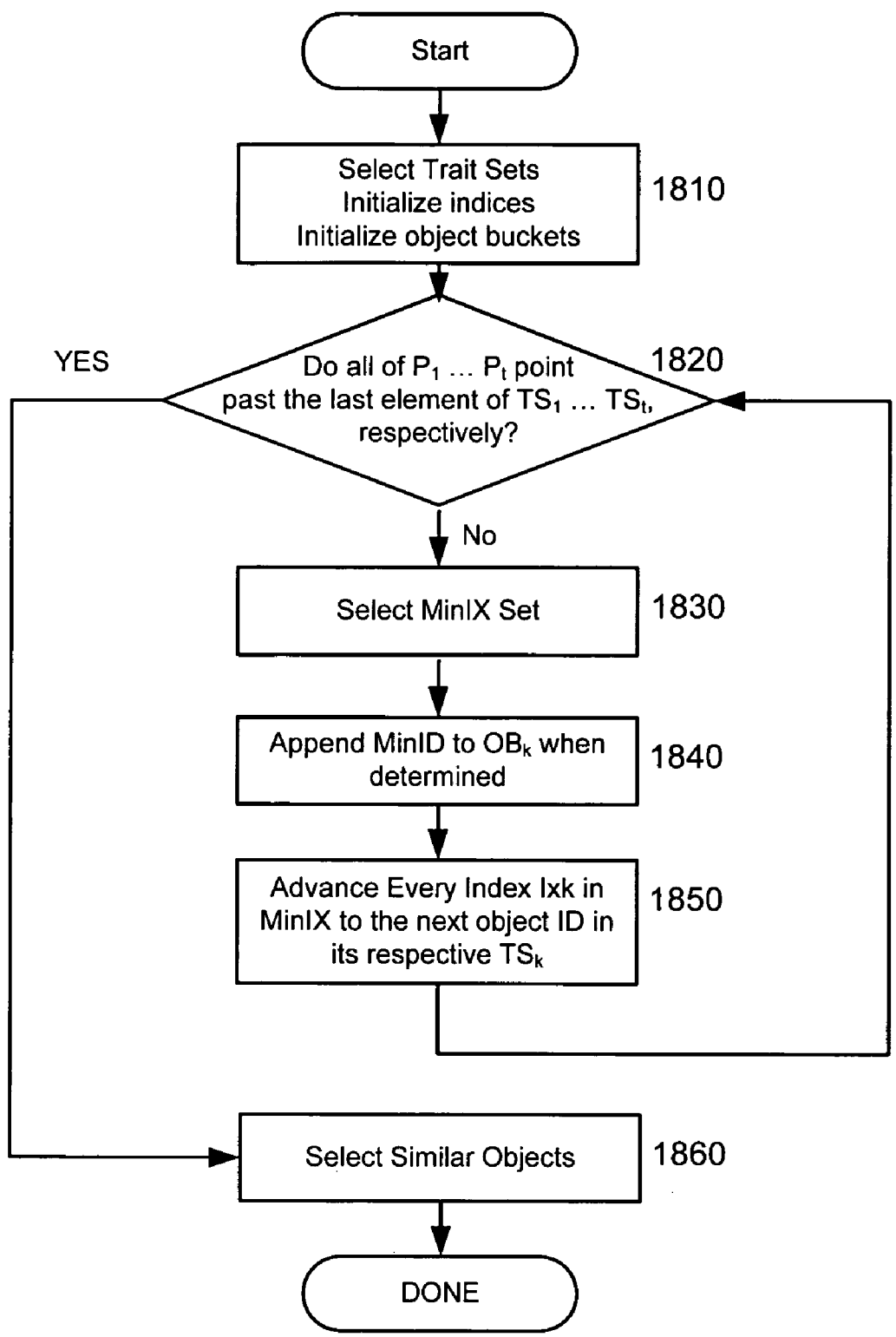
FIG. 18 illustrates a process for computing similar traits.

FIG. 18 illustrates a process for finding objects with similar traits, in accordance with aspects of the invention. According to one embodiment, to compute SimilarTraits($O_B$, Objects$_A$, x), the steps are similar to a merge sort algorithm. The algorithm uses (t−x+1) object buckets, $OB_X \ldots OB_t$, that are used to store objects belonging to Objects$_A$ that match at least x and up to and including t traits of $O_B$, respectively.

1. At block 1810, select the t TraitSets corresponding to the t traits of $O_B$: $TS_1 \ldots TS_t$. Initialize $OB_x \ldots OB_t$ to empty. Initialize indices $P_1 \ldots P_t$ to point to the first element of $TS_1 \ldots TS_t$, respectively. $TS_k[P_k]$ is the notation for the object ID pointed to by $P_k$.
2. At decision block 1820, if all of $P_1 \ldots P_t$ point past the last element of their TraitSet arrays $TS_1 \ldots TS_t$, respectively, then go to step 6 (block 1860).
3. At block 1830, the MinP set is selected which is the set of indices pointing to the minimum object ID, as follows:

$MinP = \{P_k | \forall j \in [1,t] \cdot TS_j[P_j] \geq TS_k[P_k]\}$

Let MinID be the minimum object ID pointed to by all the indices in MinP.
4. At block 1840, Let k=|MinP|, which corresponds to the number of matching traits. If k≧x and if ObjectMap (MinP) is not a dead entry, then append MinID to $OB_k$.
5. Advance every index $P_k$ in MinP to the next object ID in its respective TraitSet array $TS_k$. Go to step 2 (block 1820).

6. At block 1860, select the similar objects by first selecting objects from $OB_r$, then from $OB_{r-1}$, etc., until the desired number of similar objects has been selected or no more objects are left in $OB_x$. The object IDs produced by the above steps can be easily mapped into object references by using the ObjectMap.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method for using remote differential compression (RDC) to decrease the network bandwidth utilization of an application by identifying a file for RDC, comprising: detecting when an update occurs for a first file on a first machine; using a remote differential compression algorithm to determine data to be transferred between the first machine and a second machine relating to the first file on the first machine and at least a second file on the second machine, the remote differential compression algorithm configured to: divide the first file into a first set of chunks; wherein chunk boundaries are determined at positions in the first file based on a computed value from a fingerprinting function computing to a predetermined value, wherein the computed value is based on a calculation involving a data window, that comprises identified cut points, surrounding a current position within the first file; and wherein at least some of the chunk lengths of the first set of chunks vary in length; in response to the data within the first set of chunks, generate a first set of signatures for the first set of chunks, divide the second file into a second set of chunks, in response to the data within the second set of chunks, generate a second set of signatures for the second set of chunks, when the first file is determined to be over a predetermined size, recursively performing recursive chunking to the first set of signatures to a predetermined recursion depth to reduce a size of the first set of signatures; compare the first set of signatures to the second set of signatures, and in response to the comparison of the first set of signatures to the second set of signatures, generate the data to be transferred; transferring the data from the first machine to the second machine without transferring the entire first file from the first machine to the second machine.

2. The method of claim 1, wherein the remote differential compression algorithm is included within an application selected from at least one of: a file replication service (FRS); an application used for distributing Line-of-Business (LOB) applications; a copying application; an imaging application; a media application; a peer-to-peer file sharing application; a client side caching application; a SharePoint application; an offline address book (OAB) transfer application; an email application; a web browser application; a corporate roaming access application; a synchronization application; an update application; a backup application; a package distribution application; a source control application; a content download application; an antivirus application; a messenger application; and a WinFS synchronization application.

3. The method of claim 2, wherein the remote differential compression algorithm determines at least one of: similarity between the first file and the second file and a difference between the first file and the second file.

4. The method of claim 1, wherein the remote differential compression algorithm is integrated into a protocol.

5. The method of claim 4, wherein the protocol is at least one of: SOAP, SMB, NFS, FTP, a file transfer protocol, a file replication protocol, an object replication protocol, HTTP, WebDAV, MAPI, POP, IMAP, a binary update protocol, a data update protocol, SIP, and MSNP.

6. The method of claim 1, wherein remote differential compression algorithm is integrated into a gateway, wherein the gateway is configured to link a computing device with a server.

7. The method of claim 1, wherein the first machine and the second machine are not physically coupled together; and wherein transferring the data from the first machine to the second machine comprise: transferring signatures relating to at least one of the first file and the second file using physical media and determining needed chunks in response to the signatures; and obtaining the needed chunks using at least one of the physical media and another physical media.

8. A computer-readable storage medium having computer executable instructions for using remote differential compression (RDC) to decrease the network bandwidth utilization of an application by identifying files for RDC, comprising: detecting when a change occurs for a first file on a first machine; using a remote differential compression algorithm that is used to determine the data to be transferred between the first machine and a second machine, wherein the remote differential compression algorithm is integrated into a protocol and the remote differential compression algorithm includes: comparing signatures of chunks of the first file with signatures of chunks of an original file, wherein chunk boundaries for the chunks are determined at positions in the first file based on a computed value from a fingerprinting function computing to a predetermined value, wherein the computed value is based on a calculation involving a data window, that comprises identified cut points, surrounding a current position within the first file; and wherein at least some of the chunk lengths of the first set of chunks vary in length; and when the first file is determined to be over a predetermined size, recursively performing recursive chunking to the first set of signatures to a predetermined recursion depth to reduce a size of the first set of signatures:

generating the data to be transferred based on the comparison of signatures; and transferring the data from the first machine to the second machine without transferring the entire first file from the first machine to the second machine.

9. The computer-readable storage medium of claim 8, wherein the protocol is at least one of: SOAP, SMB, NFS, FTP, a file transfer protocol, a file replication protocol, an object replication protocol, HTTP, WebDAV, MAPI, POP, IMAP, a binary update protocol, a data update protocol, SIP, and MSNP.

10. The computer-readable storage medium of claim 8, wherein remote differential compression algorithm is integrated into a gateway, wherein the gateway is configured to link a computing device with a server.

11. The computer-readable storage medium of claim 8, wherein the first machine and the second machine are not physically coupled together.

12. The computer-readable storage medium of claim 8, wherein the remote differential compression algorithm determines at least one of: similarity between the first file and the original file and a difference between the first file and the second file.

13. A system for using remote differential compression (RDC) to decrease the network bandwidth utilization of an application by identifying files for RDC, comprising: a first machine, comprising: a remote differential application configured to perform steps, comprising: detecting when a change occurs to a first file; determining data to be transferred between the first machine and a second machine, the determination comprising a comparison of signatures of chunks of the first file with signatures of chunks of an original file and generation of the data to be transferred based on the comparison of signatures; wherein chunk boundaries for the chunks are determined at positions in the first file based on a computed value from a fingerprinting function computing to a predetermined value, wherein the computed value is based on a calculation involving a data window, that comprises identified cut points, surrounding a current position within the first file; and wherein at least some of the chunk lengths of the first set of chunks vary in length; and when the first file is determined to be over a predetermined size, recursively performing recursive chunking to the first set of signatures to a predetermined recursion depth to reduce a size of the first set of signatures; and transferring the data to the second machine without transferring the entire first file from the first machine to the second machine; and wherein the second machine is configured to perform steps including receiving the transferred data from the first machine.

14. The system of claim 13, wherein the remote differential compression algorithm is included within an application selected from at least one of: a file replication service (FRS); an application used for distributing Line-of-Business (LOB) applications; a copying application; an imaging application; a media application; a peer-to-peer file sharing application; a client side caching application; a SharePoint application; an offline address book (OAB) transfer application; an email application; a web browser application; a corporate roaming access application; a synchronization application; an update application; a backup application; a package distribution application; a source control application; a content download application; an antivirus application; a messenger application; and a WinFS synchronization application.

15. The system of claim 13, wherein the remote differential compression algorithm is integrated into a protocol.

16. The system of claim 15, wherein the protocol is at least one of: SOAP, SMB, NFS, FTP, a file transfer protocol, a file replication protocol, an object replication protocol, HTTP, WebDAV, MAPI, POP, JLMAP, a binary update protocol, a data update protocol, SlIP, and MSNP.

17. The system of claim 13, further comprising a gateway that is coupled to the first machine and the second machine, wherein a remote differential compression algorithm is integrated into the gateway.

18. The system of claim 13, wherein the first machine and the second machine are not physically coupled together; and wherein transferring the data from the first machine to the second machine comprise: transferring signatures relating to at least one of the first file and the second file using physical media and determining needed chunks in response to the signatures; and obtaining the needed chunks using at least one of the physical media and another physical media.

19. The system of claim 13, wherein the remote differential compression algorithm determines at least one of: similarity between the first file and the second file and a difference between the first file and the second file.

20. A computer-readable storage medium for using remote differential compression (RDC) to save on storage by identifying objects for RDC, comprising: locating similar files within a file system using RDC similarity determination; identifying a set of base files and computing RDC difference data for at least one similar file, the computation of RDC difference data including generation of signatures of chunks of at least one file; wherein chunk boundaries for the chunks are determined at positions in the at least one file based on a computed value from a fingerprinting function computing to a predetermined value, wherein the computed value is based on a calculation involving a data window, that comprises identified cut points, surrounding a current position within the at least one file; and wherein at least some of the chunk lengths of the first set of chunks vary in length; and when the first file is determined to be over a predetermined size, recursively performing recursive chunking to the first set of signatures; to a predetermined recursion depth to reduce a size of the first set of signatures; replacing the data of at least one similar file with a reparse point and the RDC difference data for that similar file; and determining when a similar file with a reparse point is accessed, and when the similar file is accessed: reconstructing the similar file using at least one of the base files and at least a portion of the RDC difference data.

* * * * *

UNITED STATES PATENT AND TRADEMARK OFFICE
CERTIFICATE OF CORRECTION

PATENT NO. : 7,640,363 B2  
APPLICATION NO. : 11/059916  
DATED : December 29, 2009  
INVENTOR(S) : Dan Teodosiu et al.

Page 1 of 1

It is certified that error appears in the above-identified patent and that said Letters Patent is hereby corrected as shown below:

In column 39, line 40, in Claim 16, delete "JLMAP," and insert -- IMAP, --, therefor.

In column 39, line 41, in Claim 16, delete "SIIP," and insert -- SIP, --, therefor.

Signed and Sealed this
Tenth Day of May, 2011

David J. Kappos
*Director of the United States Patent and Trademark Office*